United States Patent
Jones et al.

(10) Patent No.: US 10,147,472 B2
(45) Date of Patent: Dec. 4, 2018

(54) APPARATUSES AND METHODS FOR TARGETED REFRESHING OF MEMORY

(71) Applicant: MICRON TECHNOLOGY, INC., Boise, ID (US)

(72) Inventors: William F. Jones, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/656,084

(22) Filed: Jul. 21, 2017

(65) Prior Publication Data
US 2017/0323675 A1  Nov. 9, 2017

Related U.S. Application Data

(62) Division of application No. 14/878,354, filed on Oct. 8, 2015, now Pat. No. 9,741,409, which is a division
(Continued)

(51) Int. Cl.
| | | |
|---|---|---|
| G11C 7/00 | (2006.01) | |
| G11C 8/10 | (2006.01) | |
| G11C 11/406 | (2006.01) | |
| G11C 11/408 | (2006.01) | |
| G11C 17/16 | (2006.01) | |

(Continued)

(52) U.S. Cl.
CPC .............. *G11C 8/10* (2013.01); *G11C 11/406* (2013.01); *G11C 11/4087* (2013.01); *G11C 11/40611* (2013.01); *G11C 11/40622* (2013.01); *G11C 17/16* (2013.01); *G11C 17/18* (2013.01); *G11C 29/783* (2013.01); *G11C 2211/4068* (2013.01)

(58) Field of Classification Search
CPC .................................................. G11C 11/406
USPC .......................................................... 365/222
See application file for complete search history.

(56) References Cited

U.S. PATENT DOCUMENTS

| | | |
|---|---|---|
| 5,933,377 A | 8/1999 | Hidaka |
| 6,011,734 A | 1/2000 | Pappert |
(Continued)

FOREIGN PATENT DOCUMENTS

| | | |
|---|---|---|
| CN | 101038785 A | 9/2007 |
| CN | 101067972 A | 11/2007 |
(Continued)

OTHER PUBLICATIONS

Receipt of 1st Office Action for KR Appln No. 10-2015-7023825 dated Dec. 5, 2018.
(Continued)

*Primary Examiner* — Hoai V Ho
(74) *Attorney, Agent, or Firm* — Dorsey & Whitney LLP

(57) ABSTRACT

Apparatuses and methods for targeted row refreshes are disclosed herein. In an example apparatus, a predecoder receives a target row address and determines whether a target row of memory associated with the target row address is a primary or a redundant row of memory. The predecoder is further configured to cause one or more rows of memory physically adjacent the primary row of memory to be refreshed if the primary row is the target row or one or more rows of memory physically adjacent the redundant row of memory to be refreshed if the redundant row of memory is the target row of memory.

6 Claims, 16 Drawing Sheets

Related U.S. Application Data of application No. 13/758,667, filed on Feb. 4, 2013, now Pat. No. 9,324,398.

(51) Int. Cl.
*G11C 17/18* (2006.01)
*G11C 29/00* (2006.01)

(56) References Cited

U.S. PATENT DOCUMENTS

| | | | |
|---|---|---|---|
| 6,061,290 | A | 5/2000 | Shirley |
| 6,212,118 | B1 | 4/2001 | Fujita |
| 6,310,806 | B1 | 10/2001 | Higashi et al. |
| 6,424,582 | B1 | 7/2002 | Ooishi |
| 6,434,064 | B2 | 8/2002 | Nagai |
| 6,452,868 | B1 | 9/2002 | Fister |
| 7,057,960 | B1 | 6/2006 | Fiscus et al. |
| 7,187,607 | B2 | 3/2007 | Koshikawa et al. |
| 7,203,115 | B2 | 4/2007 | Eto et al. |
| 7,551,502 | B2 | 6/2009 | Dono et al. |
| 8,681,578 | B2 | 3/2014 | Narui |
| 8,862,973 | B2 | 10/2014 | Zimmerman et al. |
| 8,938,573 | B2 | 1/2015 | Greenfield et al. |
| 9,047,978 | B2 | 6/2015 | Bell et al. |
| 9,190,139 | B2 | 11/2015 | Jung et al. |
| 9,324,398 | B2 | 4/2016 | Jones et al. |
| 9,799,391 | B1 | 10/2017 | Wei |
| 9,805,782 | B1 | 10/2017 | Liou |
| 9,865,326 | B2 | 1/2018 | Bains et al. |
| 9,922,694 | B2 | 3/2018 | Akamatsu |
| 9,934,143 | B2 | 4/2018 | Bains et al. |
| 2001/0008498 | A1 | 7/2001 | Ooishi |
| 2002/0181301 | A1 | 12/2002 | Takahashi et al. |
| 2003/0067825 | A1 | 4/2003 | Shimano et al. |
| 2003/0123301 | A1 | 7/2003 | Jang et al. |
| 2003/0193829 | A1 | 10/2003 | Morgan et al. |
| 2004/0008544 | A1 | 1/2004 | Shinozaki et al. |
| 2004/0022093 | A1 | 2/2004 | Lee |
| 2004/0114446 | A1 | 6/2004 | Takahashi et al. |
| 2004/0184323 | A1 | 9/2004 | Mori et al. |
| 2004/0218431 | A1 | 11/2004 | Chung et al. |
| 2006/0083099 | A1 | 4/2006 | Bae et al. |
| 2007/0008799 | A1 | 1/2007 | Dono et al. |
| 2007/0030746 | A1 | 2/2007 | Best et al. |
| 2007/0297252 | A1 | 12/2007 | Singh |
| 2008/0028260 | A1 | 1/2008 | Oyagi et al. |
| 2008/0031068 | A1 | 2/2008 | Yoo et al. |
| 2008/0126893 | A1 | 5/2008 | Harrand et al. |
| 2008/0130394 | A1 | 6/2008 | Dono et al. |
| 2008/0266990 | A1 | 10/2008 | Loeffler |
| 2008/0316845 | A1* | 12/2008 | Wang ............ G11C 29/808 365/200 |
| 2009/0185440 | A1 | 7/2009 | Lee |
| 2009/0201752 | A1 | 8/2009 | Riho et al. |
| 2010/0074042 | A1 | 3/2010 | Fukuda et al. |
| 2010/0110809 | A1 | 5/2010 | Kobayashi et al. |
| 2010/0110810 | A1 | 5/2010 | Kobayashi |
| 2010/0131812 | A1 | 5/2010 | Mohammad |
| 2011/0026290 | A1 | 2/2011 | Noda et al. |
| 2011/0069572 | A1 | 3/2011 | Lee et al. |
| 2011/0216614 | A1 | 9/2011 | Hosoe |
| 2012/0014199 | A1 | 1/2012 | Narui |
| 2012/0151131 | A1 | 6/2012 | Kilmer et al. |
| 2012/0213021 | A1 | 8/2012 | Riho et al. |
| 2013/0003467 | A1 | 1/2013 | Klein |
| 2013/0003477 | A1 | 1/2013 | Park et al. |
| 2014/0050004 | A1 | 2/2014 | Mochida |
| 2014/0078842 | A1 | 3/2014 | Oh et al. |
| 2014/0089576 | A1 | 3/2014 | Bains et al. |
| 2014/0177370 | A1 | 6/2014 | Halbert et al. |
| 2014/0189228 | A1 | 7/2014 | Greenfield et al. |
| 2014/0219043 | A1 | 8/2014 | Jones et al. |
| 2015/0049567 | A1 | 2/2015 | Chi |
| 2015/0055420 | A1 | 2/2015 | Bell et al. |
| 2015/0170728 | A1 | 6/2015 | Jung et al. |
| 2015/0243339 | A1 | 8/2015 | Bell et al. |
| 2015/0279442 | A1 | 10/2015 | Hwang |
| 2015/0294711 | A1 | 10/2015 | Gaither et al. |
| 2015/0340077 | A1 | 11/2015 | Akamatsu |
| 2016/0027532 | A1 | 1/2016 | Kim |
| 2016/0042782 | A1 | 2/2016 | Narui et al. |
| 2016/0093402 | A1 | 3/2016 | Kitagawa et al. |
| 2017/0092350 | A1 | 3/2017 | Halbert et al. |
| 2018/0158504 | A1 | 6/2018 | Akamatsu |

FOREIGN PATENT DOCUMENTS

| | | |
|---|---|---|
| JP | 2011-258259 | 12/2011 |
| WO | 2014120477 | 8/2014 |
| WO | 2015030991 A1 | 3/2015 |

OTHER PUBLICATIONS

EP Search Report for app. # 16200792.6 dated Feb. 22, 2017.
First Office Action received for Application No. 103103005 dated Sep. 17, 2015.
International Search Report & Written Opinion for Appln No. PCT/US2014/012007 dated May 8, 2014.
Received 1st Office Action dated Jan. 26, 2017 for CN.01 Application No. 201480007334.X.
Supplemental Partial European Search Report for Appl. No. 14745923.4 dated Sep. 28, 2016.
U.S. Appl. No. 15/888,993, entitled "Apparatuses and Methods for Controlling Refresh Operations", filed Feb. 5, 2018, pp. all.

* cited by examiner

APPARATUSES AND METHODS FOR TARGETED REFRESHING OF MEMORY

CROSS REFERENCE TO RELATED APPLICATION(S)

This application is a divisional of U.S. patent application Ser. No. 14/878,354, filed Oct. 8, 2015, issued as U.S. Pat. No. 9,741,409 on Aug. 22, 2017, which is a divisional of U.S. patent application Ser. No. 13/758,667 filed Feb. 4, 2013, issued as U.S. Pat. No. 9,324,398 on Apr. 26, 2016. The aforementioned applications and patents are incorporated herein by reference, in their entirety, for any purpose.

TECHNICAL FIELD

Embodiments of the present invention relate generally to semiconductor memory, and more specifically, in one or more described embodiments, to refreshing a row or rows of memory physically adjacent to a target row or rows of memory.

BACKGROUND

In current memory systems, data stored in volatile memories (e.g., DRAM) must be periodically refreshed to compensate for inherent leakage of capacitors in memory cells. In essence, refreshing includes, for example, reading data out of each row of memory and subsequently writing the data back to the same respective row. As a result, the original charge level on each capacitor is restored and data preserved.

While many approaches for using memory refreshes to compensate for leakage are well known in the art, these approaches have struggled when applied to the increasingly demanding operating speeds and applications of memories today. For example, in some instances, a particular row or rows of memory may be repeatedly accessed at a high frequency. Data stored by memory cells of rows of memory physically adjacent the repeatedly accessed row of memory, may be degraded before normal refresh operations are performed to preserve the data of those adjacent rows. That is, due to coupling effects, cell to cell leakage may increase, and the repetitive accesses may degrade data of rows physically adjacent the repetitively accessed row or rows.

BRIEF DESCRIPTION OF THE DRAWINGS

FIG. 10$b$ is a schematic diagram of a target row refresh state machine according to an embodiment of the invention.

FIG. 10$c$ is a schematic diagram of a redundancy match disable control circuit according to an embodiment of the invention.

FIG. 10$d$ is a schematic diagram of a target row refresh mode latch circuit according to an embodiment of the invention.

FIG. 11$b$ is a schematic diagram of a boundary row control circuit according to an embodiment of the invention.

FIG. 12$b$ is a schematic diagram of an adjacent row control circuit according to an embodiment of the invention.

DETAILED DESCRIPTION

Apparatuses and methods for refreshing memory are disclosed herein. In accordance with one or more embodiments, one or more rows physically adjacent to a "target" row may be refreshed in a target row refresh (TRR) mode. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of the present invention relate generally to refreshing rows of memory physically adjacent a "target" row of memory, whether the target row of memory and/or the physically adjacent rows of memory are in primary or redundant portions of memory. Redundant portions of memory are used to "repair" malfunctioning primary memory. The malfunctioning primary memory may be, for example, one or more memory cells, a group of memory cells, a row of memory, etc. of a primary portion of the memory section. For example, in the event a row of primary memory malfunctions, the address of the malfunctioning row may be associated with an otherwise unused row of memory. As a result, any subsequent attempt to access the malfunctioning memory row may be redirected to the row of redundant memory to which the address is associated. An enable fuse (or anti-fuse) associated with the row of redundant memory is blown to indicate that the row has been enabled and address fuses associated with the row of redundant memory are blown to indicate the address which is associated with the row of redundant memory. Once this process has been achieved, the malfunctioning memory may be considered to be "repaired" and the malfunctioning row of memory is not accessed, and the associated row of redundant memory is accessed instead. In some instances, repaired memory may be associated with redundant memory of other memory sections.

Examples of the present invention further relate generally to targeted row refresh operations. An address for a target row of memory, that is, a target row address, may be received and latched. Based, at least in part, on an active command, the target row of memory may be activated (e.g., opened), and thereby refreshed. In refreshing the row, data may be rewritten to the memory cells of the row of memory. The row of memory will remain open until a precharge command is received, whereupon the row of memory is deactivated (e.g., closed).

Figure 1:
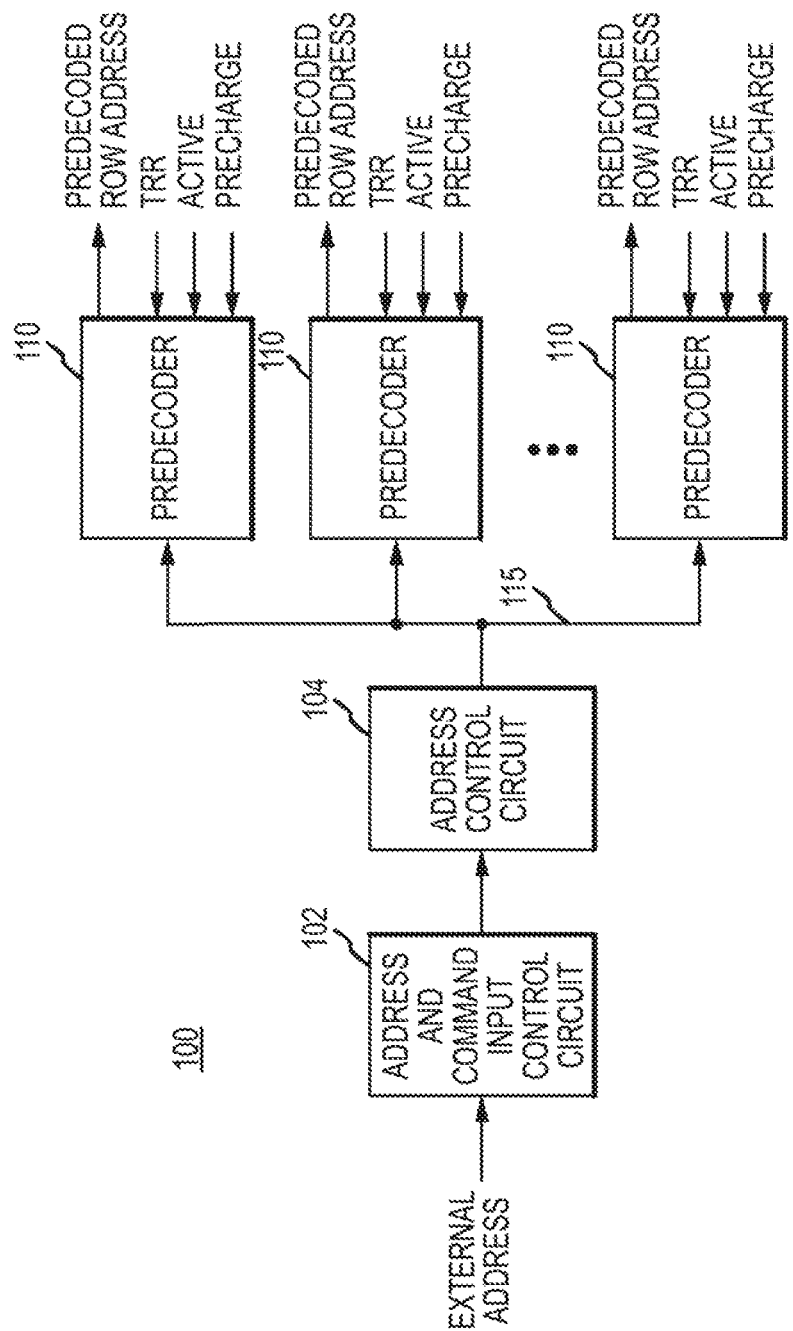
FIG. 1 is a block diagram of an apparatus according to an embodiment of the invention.

FIG. 1 is a block diagram of an apparatus 100 according to an embodiment of the invention. The apparatus 100 may include address and command input control circuit 102, an address control circuit 104, and a plurality of predecoders 110. The address and command input control circuit 102 may be coupled to the address control circuit 104, and may be configured to receive and/or buffer external addresses, and provide the external addresses to the address control circuit 104.

The address control circuit 104 may be coupled to a plurality of predecoders 110 and may be configured to provide target row addresses to one or more of the predecoders 110. In at least one embodiment, the address control circuit 104 may provide target row addresses to one or more of the predecoders 110 over a same bus 115. In other embodiments, the address control circuit 104 may be individually coupled to each of the predecoders 110 such that the address control circuit 104 may selectively provide target row addresses to each of the predecoders 110. Each of the target row addresses may be based, at least in part, on an external address provided to the address control circuit 104 from the address and command control circuit 102.

Each of the predecoders 110 may be coupled to a respective row decoder (not shown in FIG. 1) and may be configured to partially or fully decode a target row address to provide a predecoded row address to its respective decoder. Providing a predecoded row address in this manner may cause the row decoder to access a row of memory for the predecoded row address. As previously described, the accessed row of memory may be precharged, for instance, based on a precharge command.

Each predecoder 110 may further be configured to operate in a target row refresh (TRR) mode. When operating in a TRR mode, a predecoder 110 may be configured to receive row addresses and refresh rows of memory associated with the received row addresses. In one embodiment, the row addresses provided to or by a predecoder 110 during TRR mode may be associated with a target row of memory and rows of memory adjacent (e.g., physically adjacent) the target row of memory. For example, during TRR mode, three row addresses may be provided. The first row address may be a target row address TRA, and the second and third row addresses may be adjacent row addresses TRAdd1 and TRAdd2.

Hereinafter, examples will be described with respect to the row address TRAdd1 and the row address TRAdd2 comprising the row address preceding the target row address TRA and the row address following the target row address TRA, respectively. It will be appreciated, however, that in other embodiments TRAdd1 and TRAdd2 may comprise the row address following the target row address TRA and the row address preceding the target row address TRA, respectively.

In at least one embodiment, one or more row addresses may comprise a logical row address associated with a plurality of physical rows. In some instances, for example, the target row address may be a logical row address and rows physically adjacent the plurality of physical rows associated with the logical row address may be refreshed as described herein. Additionally or alternatively, a row address associated with a row physically adjacent a target row may be a logical row address. In refreshing the physically adjacent row, each of the plurality of rows associated with the logical row address may be refreshed or only the row physically adjacent the target row may be refreshed.

In one embodiment, a TRR control signal may be provided to each of the predecoders 110 of the apparatus 100 simultaneously. While the TRR control signal is in an active state, the TRA and an associated active command may be provided to one of the plurality of predecoders 110. In response, the predecoder 110 receiving the TRA may begin to operate in the TRR mode. Within an active-to-active time period (e.g., tRRD), the TRR control signal may transition to an inactive state, and other predecoders 110 may respond to independent memory accesses thereafter, while the predecoder 110 receiving the TRA operates in the TRR mode. In some embodiments, a TRR control signal may be provided from a mode register or a command decoder (not shown in FIG. 1), or by a device located external to the apparatus 100, such as a memory controller (not shown in FIG. 1).

In some instances, a target row of memory may be a row of redundant memory. That is, the row of primary memory associated with a target row address is not functional and has been repaired by a row of redundant memory to which the row address has been associated. Accordingly, predecoders 110 may be configured to cause the row of redundant memory to which the target row address is associated to be refreshed instead of the non-functioning row of memory based, at least in part, on determining the target row of memory has been repaired. As described herein, the row address for a row of redundant memory may be referred to as a redundant row address (RTRA). The RTRA may represent the relative physical location of the row of redundant memory, and may not be the same as the target row address associated with a row of redundant memory. The predecoder 110 may further be configured to cause the rows physically adjacent the row of redundant memory associated with the TRA to be refreshed instead of those physically adjacent the non-functioning row of memory. That is, the predecoder 110 may cause the rows of redundant memory associated with RTRAdd1 and RTRAdd2 to be refreshed instead of rows of primary memory associated with TRAdd1 and TRAdd2, respectively.

In an example operation of the apparatus 100, a TRR control signal may be provided to the predecoder 110 and based, at least in part, on an active command and the asserted TRR control signal, the predecoder 110 may operate in a TRR mode. One or more of the active command and the TRR control signal may be provided to the predecoder 110 by a memory controller. The TRR control signal may be asserted based, at least in part, for example, on a row (e.g. a target row) of memory being accessed more than a threshold number of times, for instance, over a particular period of time (e.g., 250,000 accesses in 64 milliseconds).

In various embodiments, a row of memory cells in the memory that has been accessed more than a threshold number of times can be identified (e.g., by a device external to the memory, such as a memory controller) as a target row of memory cells. The target row of memory cells can be associated with a target row address (TRA). In at least some embodiments, the TRA is generated by an external device and provided to the memory (e.g., to an address and command input control circuit and/or an address control circuit of the memory). As used herein, the TRA can refer to an external address generated and provided to the memory, and/or can refer to an internal address, based at least in part on such an external address, that is generated and provided to a predecoder of the memory, such as by an address and command input control circuit and/or an address control circuit.

The target row address TRA may be received by a predecoder 110, and in response the predecoder may determine whether the row of primary memory associated with the target row address TRA has been repaired. For example, the predecoder 110 may determine whether a row of redundant memory has repaired the row of primary memory associated with the TRA. If the row of primary memory has not been repaired, the predecoder 110 may cause the row of primary memory to be refreshed, at least in some embodiments. If the row of primary memory has been repaired, the predecoder 110 may determine which row of redundant memory to access as the target row of memory instead of the row of primary memory. In at least one embodiment, the target row may be refreshed. In other embodiments, the target row may not be refreshed.

In this manner, subsequent row addresses (e.g., TRAdd1dd1 and TRAdd2) may also be provided to the address and command input control circuit 102, where such subsequent row addresses are associated with rows of memory physically adjacent the target row of memory as described above. In response to these additional addresses, rows of memory physically adjacent the accessed target row of memory (e.g., whether in primary or redundant memory) may be refreshed. As described, this may include refreshing rows of primary memory, refreshing rows of redundant memory, or refreshing combinations of rows of primary and/or redundant memory.

In some embodiments, a predecoder of the memory can be provided with a first row address (TRAdd1) and a first active command, and a second row address TRAdd2 and a second active command. The TRAdd1 can be adjacent to and precede the TRA, and the TRAdd2 can be adjacent to and follow the TRA. As was the case with the TRA, the TRAdd1 and/or TRAdd2 can each refer to a respective external address generated and provided to the memory, and/or can refer to a respective internal address, based at least in part, on such an external address, that is generated and provided to a predecoder of the memory.

In one or more embodiments, a memory controller can provide the TRAdd1 and/or the TRAdd2 (as well as the first and second active commands) to the memory, wherein the TRAdd1 and/or TRAdd2 can be provided to the predecoder (e.g., by an address and command input circuit and/or an address control circuit). In another embodiment, logic internal to the memory (e.g., a counter or inversion logic, whether part of or separate from the address control circuit and/or address and command input circuit) can generate the TRAdd1 and/or the TRAdd2 responsive to being provided with the TRA (e.g., via an address and command input control circuit and/or an address control circuit), and provide the TRAdd1 and/or the TRAdd2 to the predecoder.

For instance, in some embodiments, a target row address TRA may be received by one or more of the address control circuit 104 and a predecoder 110 and based, at least in part, on TRA, one or more of the address control circuit 104 and the predecoder 110 may determine respective addresses for TRAdd1 and TRAdd2 and/or RTRAdd1 and RTRAdd2. By way of example, a predecoder 110 may receive a target row address TRA and determine whether the row associated with TRA is repaired. If the row is not repaired, the predecoder 110 may generate row addresses TRAdd1 and TRAdd2. If the row is repaired, the predecoder 110 may generate row addresses RTRAdd1 and RTRAdd2. These generated addresses may be used to cause a refresh of rows physically adjacent the target row as described.

The predecoder can be configured to cause a first row of memory cells physically adjacent to the target row of memory cells to be refreshed responsive to being provided with the TRAdd1 and the first active command, and to cause a second row of memory cells physically adjacent to the target row of memory cells to be refreshed responsive to being provided with the TRAdd2 and the second active command. As used herein, a row of memory cells can refer to a single row of memory cells or a combination of rows of memory cells, the latter of which being sometimes collectively referred to in the art as a "fat row".

Although, at least in some embodiments, the TRAdd1 is provided by a memory controller along with the first active command and the TRAdd2 is provided by the memory controller along with the second active command, embodiments disclosed herein are not limited to the same. For example, in some embodiments, the first and/or second active commands can be provided by a memory controller along with another row address, such as the TRA and/or other row address.

In addition, in some embodiments, the predecoder can also be provided with the TRA and a third active command. For example, a memory controller can provide the TRA to an address control circuit and/or address and command input control circuit of the memory, wherein the address control circuit and/or address and command input control circuit can provide the TRA (e.g., along with the TRAdd1 and/or TRAdd2) to the predecoder. Although referred to herein as a "third" active command, that term is only used herein for convenience of distinction, as the third active command can in some embodiments be provided before the first and/or second active commands.

For example, in at least one embodiment, a memory controller can first provide the TRA and third active command, then provide the TRAdd1 and first active command, and then provide the TRAdd2 and second active command. In another embodiment, the memory controller can first provide the TRA and third active command, then provide the first active command (along with the TRA or other row address), and then provide the second active command (along with the TRA or other row address), wherein the memory can internally generate the TRAdd1 and/or the TRAdd2 and cause the same to be provided to the predecoder.

In some embodiments, the predecoder can be configured to cause the target row of memory cells to be refreshed responsive to being provided with the TRA and the third active command. However, it could also be desirable to avoid unnecessarily accessing the target row of memory cells. Accordingly, in other embodiments, the predecoder does not cause the target row of memory cells to be refreshed (even if provided with the TRA and/or the third active command).

Following the refreshing of the physically adjacent rows of memory, the predecoder 110 may exit the TRR mode. In some embodiments, the predecoder 110 may automatically exit the TRR mode after receiving a precharge command following the refreshing of the physically adjacent rows. In other embodiments, the predecoder 110 may exit the TRR mode based, at least in part, on a control signal provided by other circuits, such as a mode register (not shown).

The predecoder 110 may further be configured to selectively cause rows adjacent the target row to be refreshed. For example, as will be explained in more detail below, a predecoder 110 may be configured to cause adjacent rows of redundant memory to be refreshed only if the adjacent rows are enabled. In this manner, accesses of malfunctioning and/or damaged rows may be avoided. Moreover, if the target row is a boundary row (e.g., a row of primary memory adjacent a redundant portion or a row of redundant memory adjacent a primary portion), the predecoder 110 may selectively cause a row in the adjacent row in the neighboring portion to be refreshed. If a target row is an exterior row of either the primary or redundant portions, the predecoder 110 may be configured to cause only the target row and/or the one interior row adjacent the target row to be refreshed.

Refreshing rows of memory physically adjacent to a target row of memory may, for instance, compensate for charge leakage resulting from a high number of accesses of the target row of memory over a particular period of time. Because accessing rows of memory at relatively high frequencies may cause charge leakage in adjacent rows of memory, rows of memory adjacent a repeatedly accessed row of memory can be refreshed to maintain the integrity of data stored by the memory cells of the adjacent rows of memory.

Figure 2:
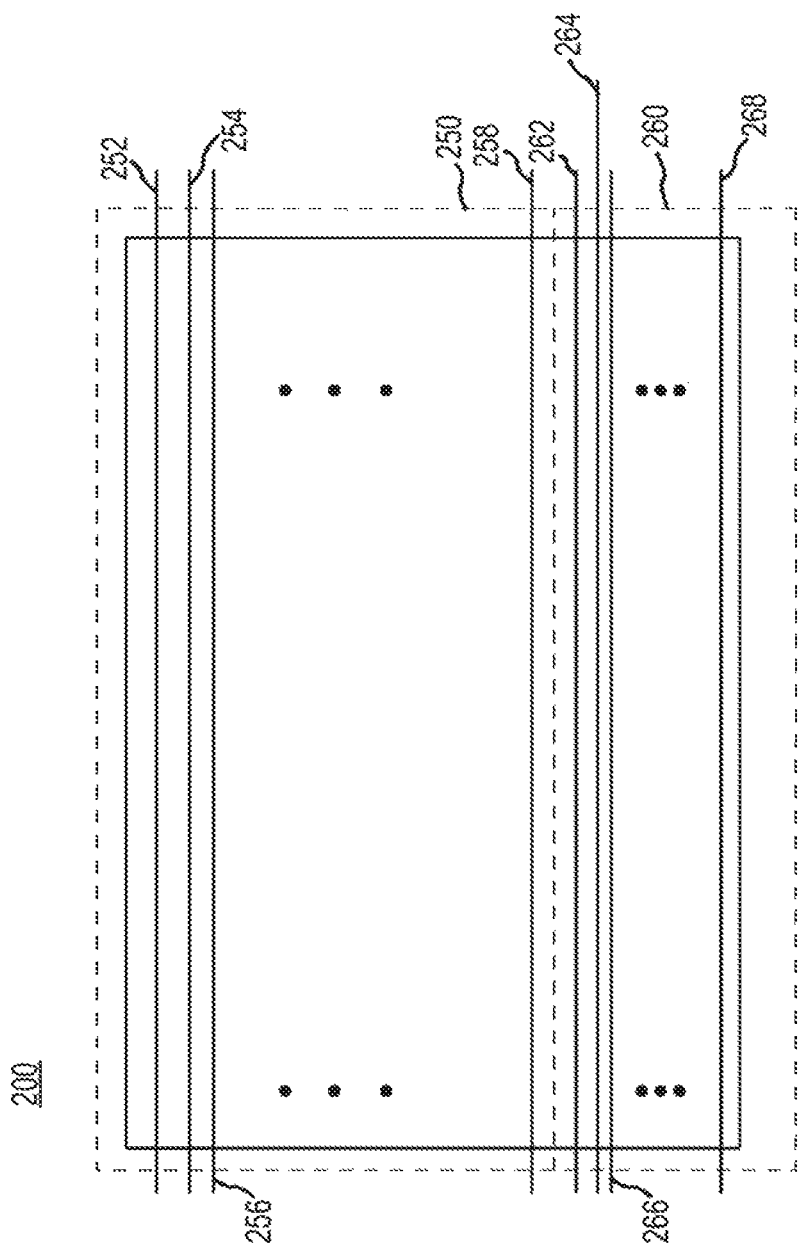
FIG. 2 is a block diagram of a memory section according to an embodiment of the invention.

FIG. 2 is a block diagram of a memory section 200 according to an embodiment of the invention. The memory section 200 may, for instance, be used in operation with the predecoder 100 of FIG. 1 and may include a primary portion 250 and a redundant portion 260.

The primary portion 250 may include a plurality of rows of memory, which are hereinafter sometimes referred to as "primary rows" such as primary rows of memory 252, 254, 256, 258. The primary row of memory 252 may be the first row of memory of the primary portion 250, and may be referred to as the exterior primary row of memory. Primary rows of memory 254, 256 may be the second, and third rows of memory of the primary portion 250 respectively, and may be referred to as interior primary rows of memory. Primary row of memory 258 may be the last row of memory of the primary portion 250, and may be referred to as the boundary primary row of memory.

The redundant portion 260 may include a plurality of rows of memory, which are hereinafter sometimes referred to as "redundant rows" such as redundant rows of memory 262, 264, 266, 268. The redundant rows of memory 264, 266 may be the second and third rows of memory of the redundant portion 260, and may be referred to as interior redundant rows of memory. The redundant row of memory 262 may be a first row of memory of the redundant portion 260, and may be referred to as the boundary redundant row of memory. The redundant row of memory 268 may be the last row of memory of the redundant portion 260, and may be referred to as the exterior redundant row of memory. An access of any of the rows of memory 252, 258, 262, 268 may result in a boundary condition, and more specifically an access of either the boundary primary row of memory 258 or the boundary redundant row of memory 262 may result in a boundary condition.

As will be appreciated from FIG. 2, refreshing rows of memory physically adjacent a target row of memory may include determining, for example, whether the target row of memory is a primary row of memory or a redundant row of memory, and may further include determining whether the target row of memory is at the boundary of the primary portion 250 and the redundant portion 260.

Figure 3:
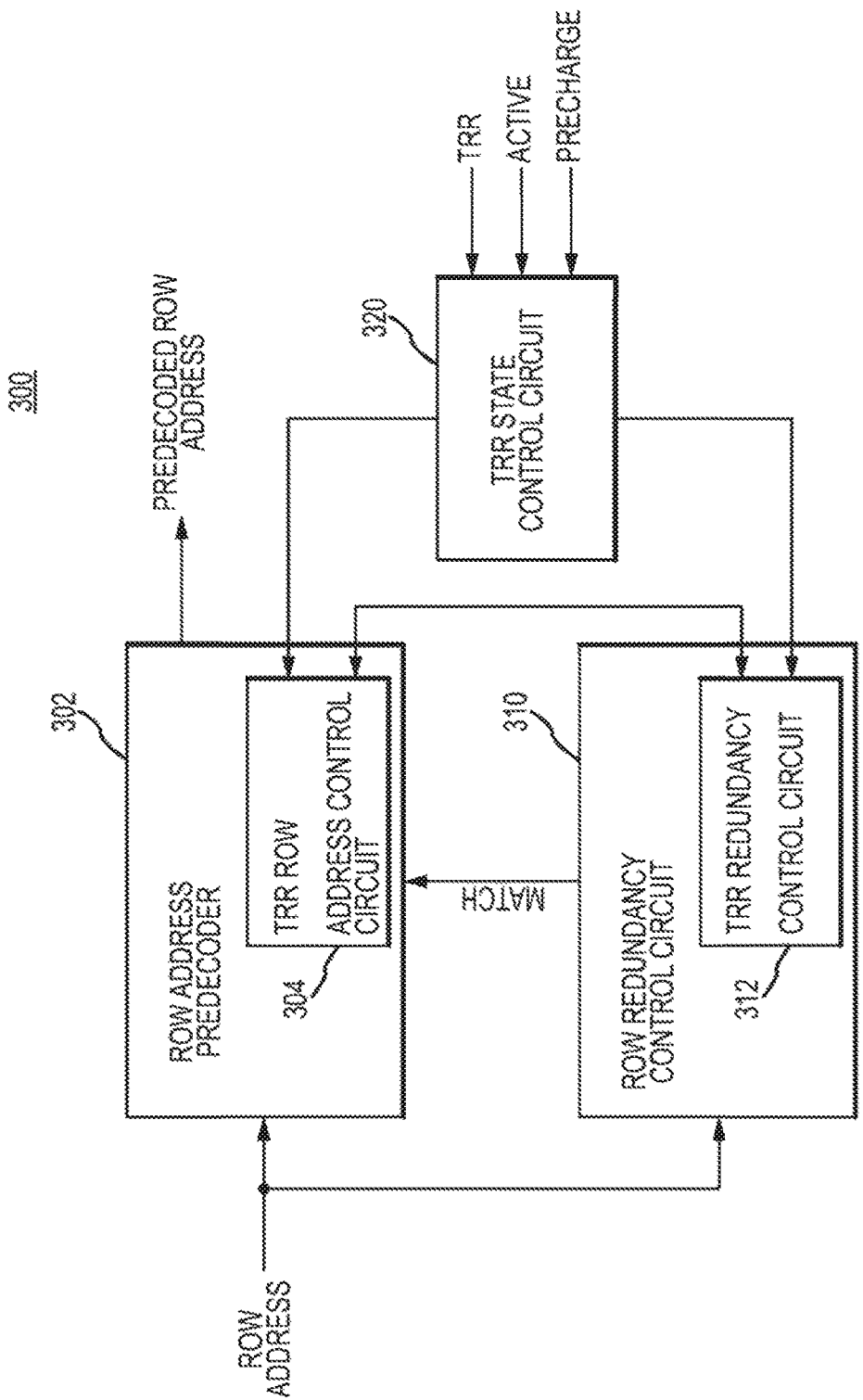
FIG. 3 is a block diagram of a predecoder according to an embodiment of the invention.

FIG. 3 is a block diagram of a predecoder 300 according to an embodiment of the invention. The predecoder 300 may be used to implement the predecoder 110 of FIG. 1. The predecoder 300 includes a row address predecoder 302, a row redundancy control circuit 310, and a TRR state control circuit 320.

The row address predecoder 302 may be configured to receive row addresses, for instance, from the address control circuit 104 of FIG. 1, and may further be configured to partially or fully decode the row addresses to provide predecoded row addresses to a row decoder (not shown in FIG. 3). Providing row addresses in this manner may cause the row for the predecoded row address to be accessed by the row decoder.

The row address predecoder 302 may include a TRR row address control circuit 304. As will be explained in more detail below, the TRR row address control circuit 304 may be configured to control the refresh of rows of memory during a TRR mode when the target row of memory is a primary row of memory. For example, in instances in which the target row of memory is a boundary primary row of memory, the TRR row address control circuit 304 may be configured to cause the boundary redundant row of memory physically adjacent the target row of memory (e.g., the boundary primary row of memory) to be refreshed if the boundary redundant row of memory has been enabled (e.g., used to repair a primary row of memory).

The row redundancy control circuit 310 may be coupled to the row address predecoder 302 and may be configured to receive row addresses from the address control circuit 304. Based, at least in part, on each received target row address, the row redundancy control circuit 310 may determine whether the primary row of memory associated with the target row address has been repaired, that is, whether the target row of memory is a redundant row of memory. If the primary row of memory associated with the target row address has been repaired, the row redundancy control circuit 310 may provide a MATCH control signal indicating the row has been repaired and/or the redundant row address of the redundant row of memory used for the repair. Based, at least in part, on the MATCH control signal, the path of the row address (e.g., a target row address TRA) through the row address predecoder 302, may be disabled, and the redundant row address of the redundant row of memory may instead be used to provide the predecoded row address.

The row redundancy control circuit 310 may include a TRR redundancy control circuit 312. As will be explained in more detail below, the TRR redundancy control circuit 312 may be configured to control the refresh of rows of memory during a TRR mode when the target row of memory is a redundant row of memory. As an example, in instances wherein the target row of memory is a boundary redundant row of memory, the TRR redundancy control circuit 312 may be configured to cause the boundary primary row of memory physically adjacent the boundary redundant row of memory (e.g., the target row of memory) to be refreshed if the boundary primary row of memory has not been repaired. As another example, the TRR redundancy control circuit 312 may be configured to cause only enabled adjacent redundant rows of memory to be refreshed.

The TRR state control circuit 320 may be coupled to the TRR row address control circuit 304 of the row address predecoder 302, and further coupled to the TRR redundancy control circuit 312 of the row redundancy control circuit 310. The TRR state control circuit 320 may be configured to receive TRR control signals, and precharge and active commands. The TRR state control circuit 320 may enable the TRR row address control circuit 304 and the TRR redundancy control circuit 312 and begin to operate in a TRR mode based on a TRR control signal and an active command. Subsequently, the TRR state control circuit 320 may disable the TRR row address control circuit 304 and the TRR redundancy control circuit 312 and exit the TRR mode. In one embodiment, the TRR state control circuit 320 may disable the TRR row address control circuit 304 and the TRR redundancy control circuit 312, and exit the TRR mode based, at least in part, on a precharge command, such as the precharge command corresponding to the TRAdd2 row address.

The TRR state control circuit 320 may further be configured to disable comparison logic in the row redundancy control circuit 310 based, at least in part, on a target row of memory being repaired (e.g., the target row of memory is a redundant row of memory). In one embodiment, for example, if TRAdd1 or TRAdd2 are addresses for repaired rows, the TRR state control circuit 320 may disable comparison logic to prevent the row redundancy control circuit 310 from providing a MATCH control signal to the row address predecoder 302. In other embodiments, the TRR state control circuit 320 may prevent received addresses from being compared to repaired row addresses.

Figure 4:
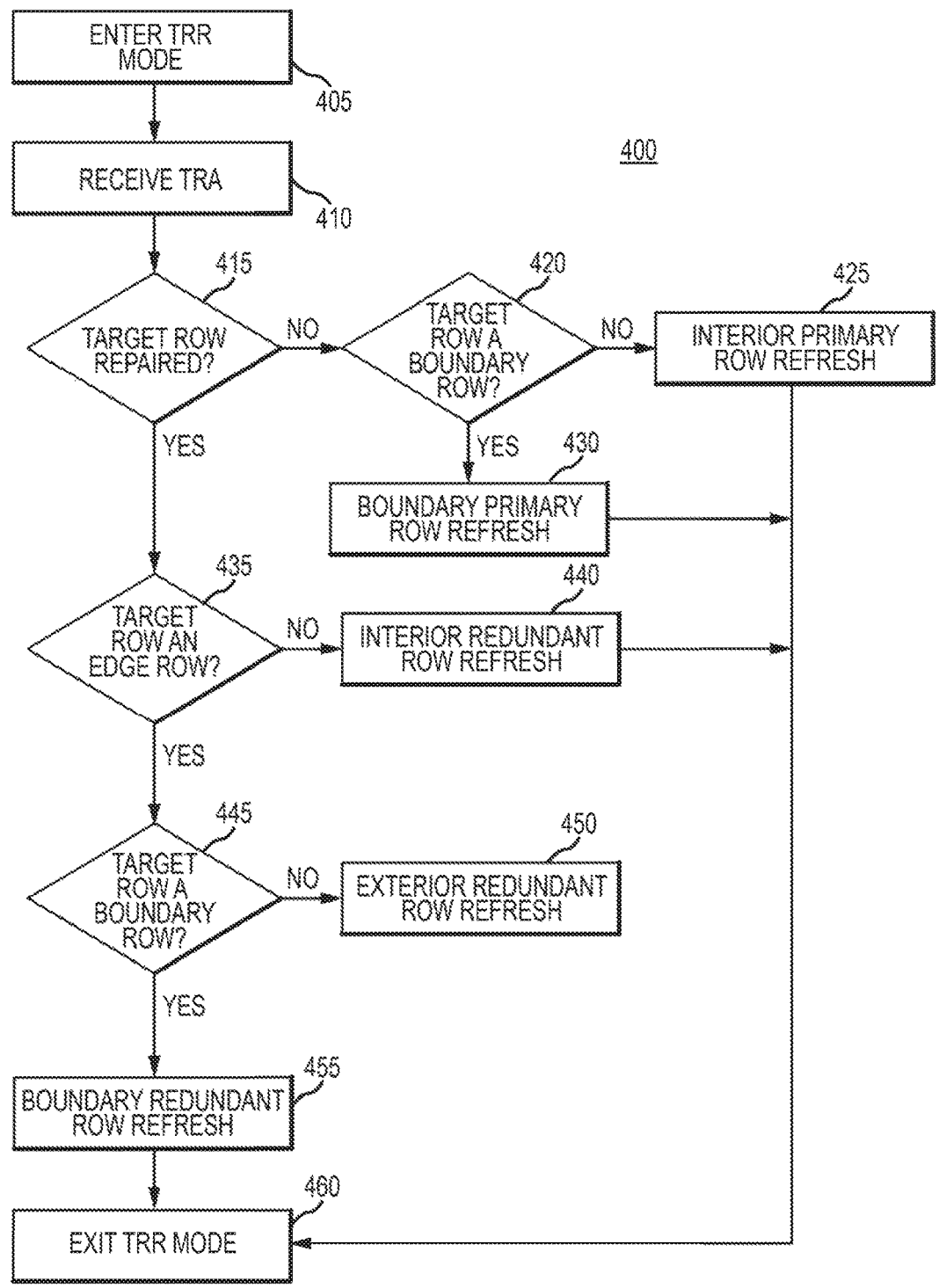
FIG. 4 is a flowchart of a method for refreshing rows of a memory section according to an embodiment of the invention.

FIG. 4 is a flowchart of a method 400 for refreshing rows of memory according to an embodiment of the invention. The method 400 may be implemented, for example, by one or more components of the predecoder 300 of FIG. 3. At an act 405, a TRR mode is entered, and in response, the TRR state control circuit 320 may begin to operate in a TRR mode. The TRR state control circuit 320 may further provide one or more control signals to the TRR row address control circuit 304 and the TRR redundancy control circuit 312, and as a result, both the TRR row address control circuit 304 and the TRR redundancy control circuit 312 may be enabled. At an act 410, a target row address TRA may be received by the row address predecoder 302 and row redundancy control circuit 310.

Based, at least in part, on the target row address TRA, at an act 415, the row redundancy control circuit 310 may determine whether the target row of memory has been repaired (e.g., the target row of memory is a redundant row of memory), and if so, provide a MATCH control signal indicating that the target row of memory has been repaired and/or the redundant address of the redundant row of memory used for the repair. If the target row of memory has not been repaired (e.g., the target row of memory is a primary row of memory), the TRR row address control circuit 304 may determine at an act 420 whether the target row of memory is a boundary primary row of memory. If the target row of memory is not a boundary primary row of memory, indicating that the target row of memory is an interior primary row of memory, at an act 425, the TRR row address control circuit 304 may cause the interior primary row of memory that is the target row of memory to be refreshed (e.g. by allowing the TRA to be provided to the row decoder), and further cause any unrepaired rows of memory physically adjacent the interior primary row of memory that is the target row of memory to be refreshed (e.g., by allowing TRAdd1 and TRAdd2, as provided by the address control circuit 104, to be provided to the row decoder). If the target row of memory is a boundary primary row of memory, at an act 430, the TRR row address control circuit 304 may cause one or more rows physically adjacent the boundary primary row of memory to be refreshed.

If at the act 415 the target row of memory is determined to be repaired (e.g., the target row is a redundant row of memory), the TRR redundancy control circuit 312 may determine at an act 435 whether the target row of memory is an edge row of memory (e.g., an exterior row of redundant memory or boundary row of redundant memory). If the target row of memory is not an edge row, at an act 440 the TRR redundancy control circuit 312 may cause a refresh of an interior redundant row of memory that repaired the target row of memory and any enabled rows of redundant memory physically adjacent the interior redundant row of memory as well. If it is determined at the act 435 that the target row of memory is an edge row of memory, at the act 445 the TRR redundancy control circuit 312 may determine whether the target row of memory is a boundary redundant row of memory. If the target row of memory is not a boundary redundant row of memory (and therefore is an exterior redundant row of memory), the TRR redundancy control circuit 312 may cause a refresh of the exterior redundant row of memory and/or an interior redundant row of memory adjacent the exterior redundant row of memory if enabled. If at the act 445 it is determined that the target row of memory is a boundary redundant row of memory, the TRR redundancy control circuit 312 may cause the boundary redundant row of memory and/or one or more physically adjacent rows of memory to be refreshed, if enabled (in the case of the adjacent row of redundant memory) and not repaired (in the case of the adjacent row of primary memory).

At an act 460, the row refreshes may be completed for the TRR mode, and the TRR state control circuit 320 may disable the TRR row address control circuit 304 and the TRR redundancy control circuit 312, and further cease operating in a TRR mode. As described, the TRR state control circuit 320 may be configured to disable the TRR row address control circuit 304 and the TRR redundancy control circuit 312 and/or exit the TRR mode based, at least in part, on receipt of a precharge command for the final TRR row address TRAdd2.

While the acts of the method 400 have been described as having a particular sequence, it will be appreciated that the acts may be performed in any sequence. The method 400 may further comprise all or less than all of the described acts of the method 400 or may include additional acts. In some embodiments, redundant rows need not be repaired. By way of example, less than all rows of redundant memory, such as every other row, may be used such that no adjacent redundant rows need be refreshed. Because only particular redundant rows may be used such that no two used redundant rows are adjacent, once a target row has been determined to be a redundant row, no refreshes of adjacent rows need occur. In at least one embodiment, unused redundant rows may be purposefully disabled such that these rows may not be used for repair of primary rows. In other embodiments, the row address predecoder 302 and/or the row redundancy control circuit 310 may include control logic configured to allow only particular redundant rows to be used for repair of primary rows.

Moreover, while acts of the method 400 have been described in a sequential manner, it will be appreciated that one or more of the acts of the method 400 may be performed in parallel, concurrently, and/or in an overlapping manner. For example, in at least one embodiment, two or more of the acts 415, 420, 435, and 445 may be partially or fully performed at a same time.

Figure 5:
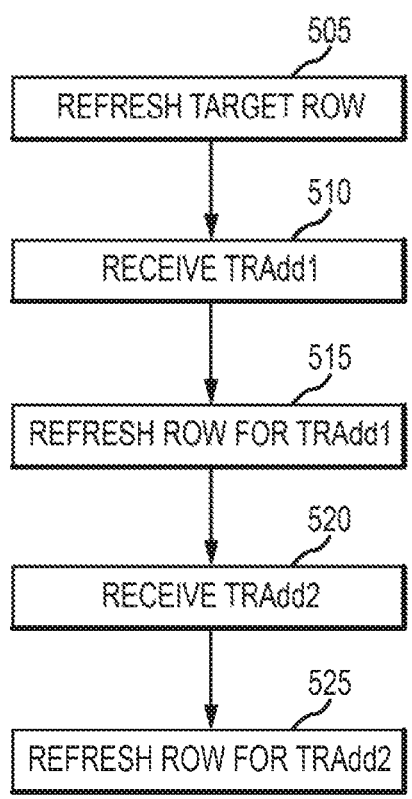
FIG. 5 is a flowchart of a method for refreshing interior rows of a primary portion of a memory section according to an embodiment of the invention.

FIG. 5 is a flowchart of a method 500 for refreshing interior rows of a primary portion of a memory section according to an embodiment of the invention. For example, the target row of memory and the physically adjacent rows of memory are primary rows of memory. The method 500 may be used, for instance, to implement the act 425 of the method 400 of FIG. 4. At an act 505, the row address predecoder 302 (e.g., the TRR row address control circuit 304) may cause the row of primary memory associated with the target row address TRA to be refreshed. Subsequently at an act 510, the row address TRAdd1 may be received by the row address predecoder 302 and the row redundancy control circuit 310. At an act 515, the row address predecoder 302 may cause the row for TRAdd1 to be refreshed, and at an act 520, the row address TRAdd2 may be received by the row address predecoder 302 and the row redundancy control circuit 310. At an act 525, the row address predecoder 302 may cause the row for TRAdd2 to be refreshed.

Figure 6:
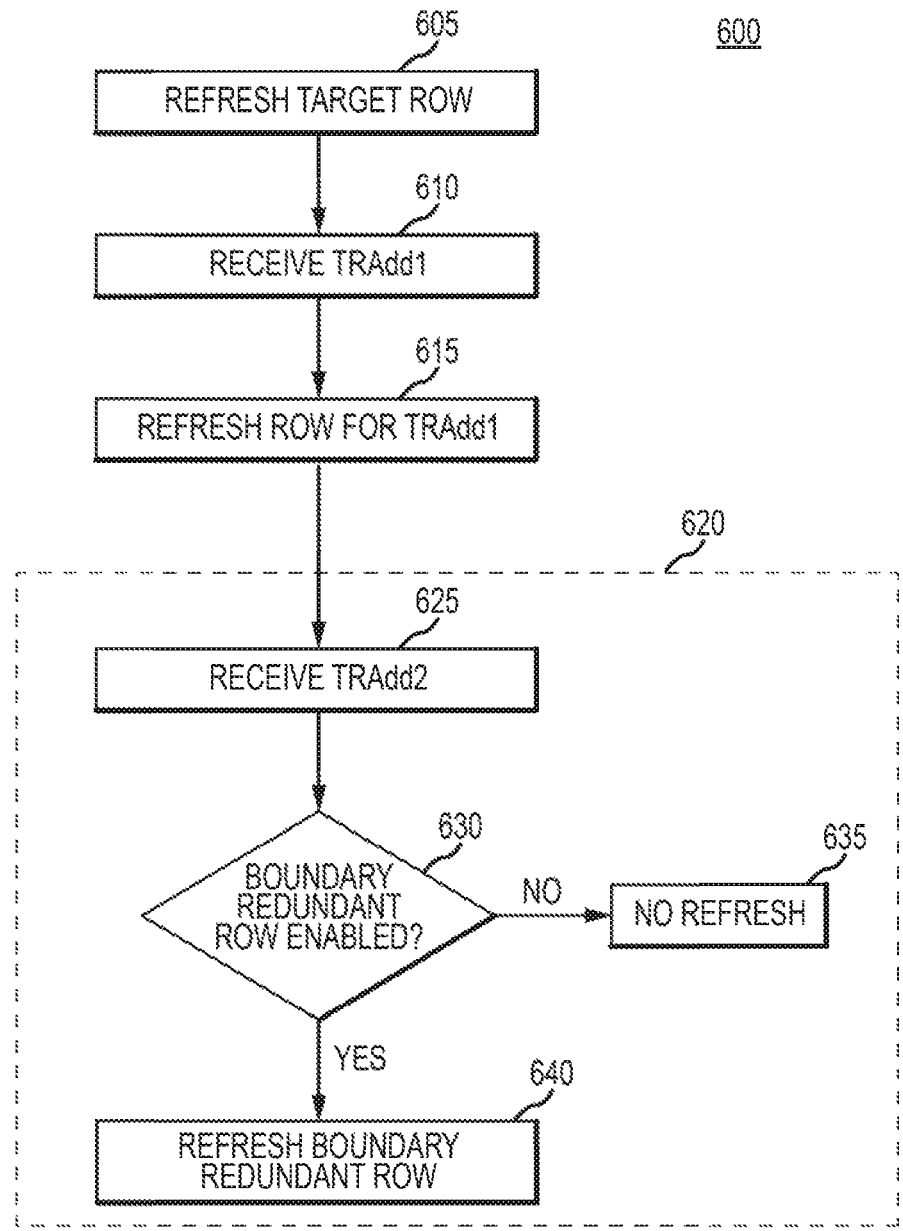
FIG. 6 is a flowchart of a method for refreshing a boundary row of a primary portion of a memory section according to an embodiment of the invention.

FIG. 6 is a flowchart of a method 600 for refreshing a boundary row of a primary portion of a memory section according to an embodiment of the invention. For example, the target row of memory is a boundary primary row of memory, and one adjacent row of memory is a primary row of memory and another adjacent row of memory is a boundary redundant row of memory. The method 600 may be used to implement the act 430 of the method 400 of FIG. 4. At an act 605, the row address predecoder 302 may cause the row of memory associated with the target row address TRA to be refreshed. At act 610, the row address TRAdd1 may be received by the row address predecoder 302 and the row redundancy control circuit 310. At an act 615, the row address predecoder 302 may cause the row associated with TRAdd1 to be refreshed.

As described above, in instances where the target row of memory is a boundary primary row of memory, the boundary redundant row of memory is an adjacent row that may be refreshed. Accordingly, at an act 620, the TRR row address control circuit 304 may cause the boundary redundant row of memory to be refreshed instead of the primary row of memory at row address TRAdd2, associated with the TRR active command. For example, the TRR row address control circuit 304 may cause the redundant row address RTRAdd2 to be decoded by the row decoder instead of the row address TRAdd2.

Causing a refresh in this manner may, for instance, include disabling the normal path of row addresses in the row address decoder and/or forcing an address, for instance, a row address associated with the boundary redundant row of memory, to be provided as the next predecoded row address. As will be described, the forced address may subsequently be refreshed. In at least one embodiment, the forced address may be refreshed based, at least in part, on a received row address (e.g., TRAdd2). By way of example, the row address may be refreshed responsive, at least in part, to receipt of the row address and associated TRR active command.

For Example, at an act 625, the row address TRAdd2 may be received, and at an act 630, the TRR row address control circuit 304 may determine whether the boundary redundant row of memory is enabled. As described, the determination may be made based, at least in part, on a state of an enable fuse of the boundary redundant row of memory. If it is determined at the act 630 that the boundary redundant row of memory has not been enabled, the boundary redundant row of memory is not refreshed at an act 635 (and neither is the row of memory associated with the row address TRAdd2). If the boundary redundant row of memory is determined to be enabled, however, the row address TRR row address control circuit 304 may cause the boundary redundant row of memory to be refreshed at an act 640.

With respect to methods 500 and 600, in some instances, adjacent primary rows (e.g., rows associated with row addresses TRAdd1 and TRAdd2) may be repaired. In one embodiment, these rows may be refreshed normally. That is, a redundant row associated with the repaired adjacent primary row may be refreshed. In other embodiments, a refresh operation of the redundant row associated with the repaired adjacent primary row may be prevented as it may not be necessary when the redundant row associated with the repaired adjacent primary row is not physically adjacent the target row.

Figure 7:
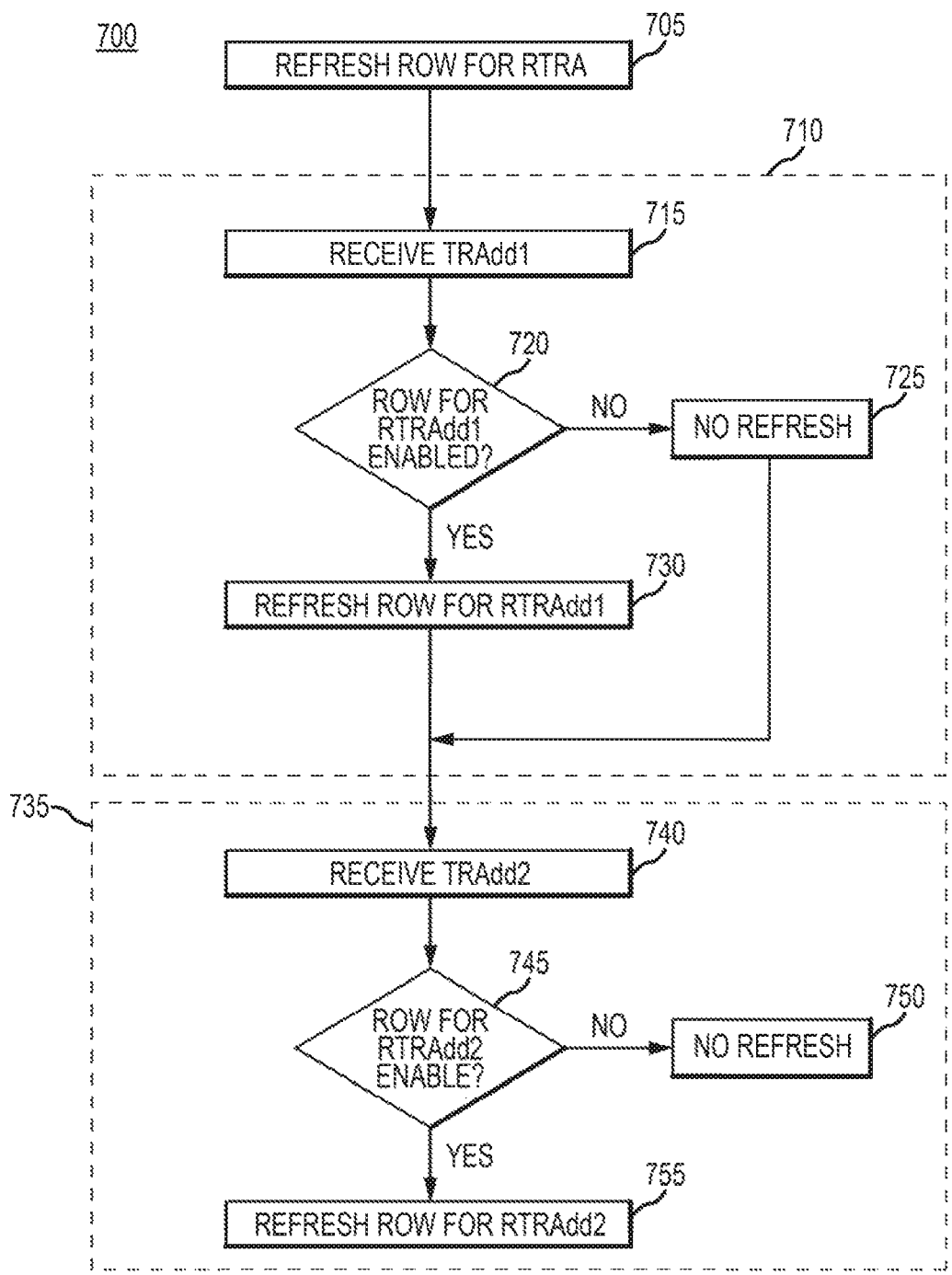
FIG. 7 is a flowchart of a method for refreshing interior rows of a redundant portion of a memory section according to an embodiment of the invention.

FIG. 7 is a flowchart of a method 700 for refreshing interior rows of a redundant portion of a memory section according to an embodiment of the invention. For example, the target row of memory, and the physically adjacent rows of memory are redundant rows of memory. The method 700 may be used to implement the act 440 of the method 400 of FIG. 4. At an act 705, the row address predecoder 302 may cause the redundant row of memory associated with the target row of memory (e.g. the row address predecoder 302 may cause the row of redundant memory associated with redundant row address RTRA to be refreshed instead of the row of primary memory associated with the row address TRA) to be refreshed. At an act 710, the TRR redundancy control circuit 312 may cause the row of memory associated with the redundant row address RTRAdd1 to be refreshed instead of the primary row of memory associated with the row address, TRAdd1. For Example, at an act 715, the row address TRAdd1 may be received. If it is determined at an act 720 that the row associated with RTRAdd1 is not enabled, no rows of memory are refreshed at an act 725. If the row of memory associated with RTRAdd1 is enabled, however, the TRR redundancy control circuit 312 may cause the row of memory associated with RTRAdd1 to be refreshed at an act 730.

At an act 735, the TRR redundancy control circuit 312 may cause the row of memory associated with the redundant row address RTRAdd2 to be refreshed instead of the row of memory associated with the row address TRAdd2. For example, at an act 740 the row address TRAdd2 may be received. If it is determined at an act 745 that the row of memory associated with the redundant row address RTRAdd2 is not enabled, at an act 750 no rows of memory are refreshed. If the row of memory associated with the redundant row address RTRAdd2 is enabled, the TRR redundancy control circuit 312 may cause the row of memory associated with the row address RTRAdd2 to be refreshed at an act 755.

Figure 8:
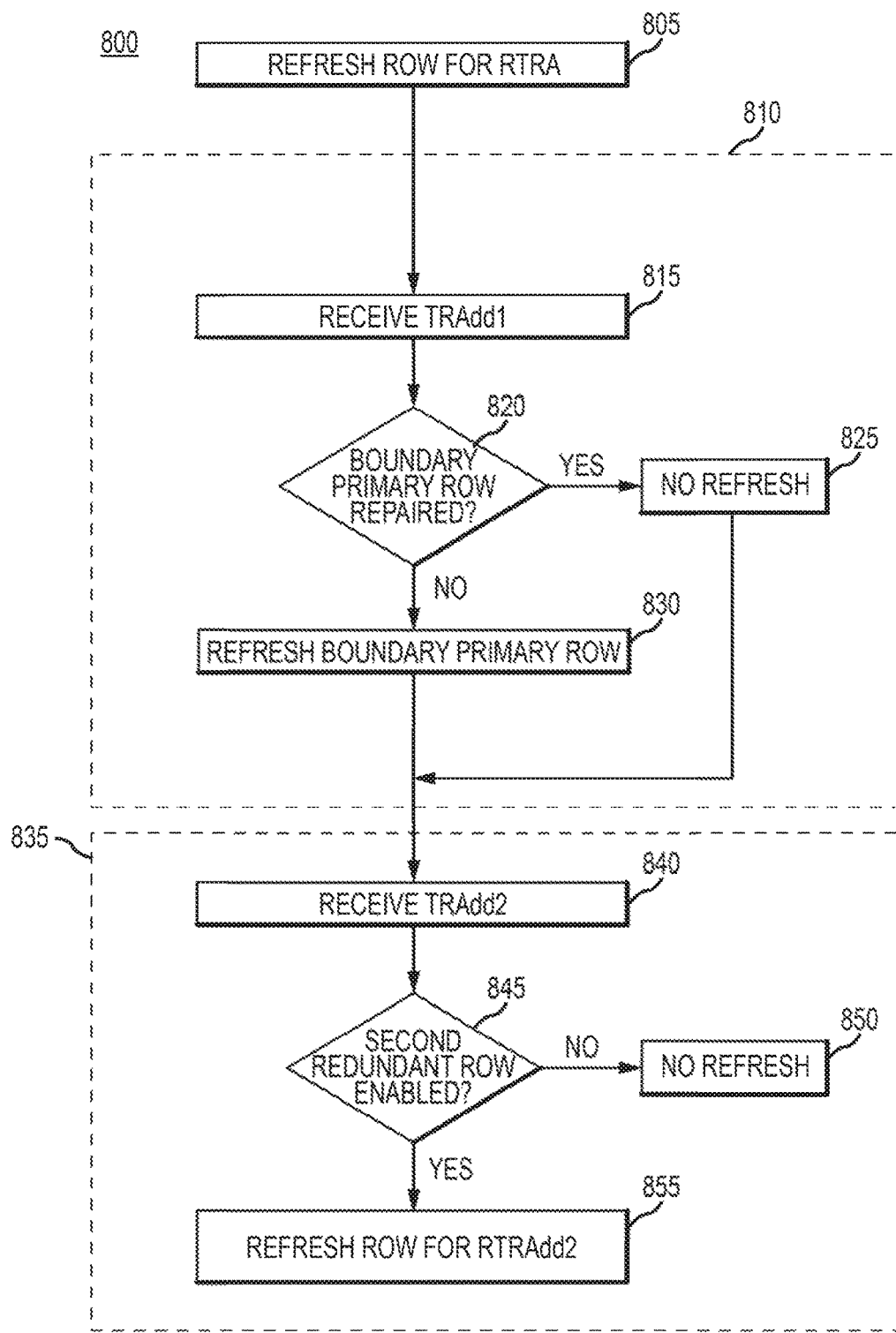
FIG. 8 is a flowchart of a method for refreshing a boundary row of a redundant portion of a memory section according to an embodiment of the invention.

FIG. 8 is a flowchart of a method 800 for refreshing a boundary row of a redundant portion of a memory section according to an embodiment of the invention. For example, the target row of memory is the boundary redundant row of memory. One of the physically adjacent rows of memory may be the boundary primary row of memory and another physically adjacent row of memory may be a redundant row of memory. The method 800 may be used to implement the act 455 of the method 400 of FIG. 4. At an act 805, the row address predecoder 302 may cause the boundary redundant row of memory associated with the target row of memory to be refreshed. At an act 810, the TRR row address control circuit 304 and/or the TRR redundancy control circuit 312 may cause the boundary primary row of memory to be refreshed instead of the row of memory associated with the row address TRAdd1.

For example, at an act 815, the row address TRAdd1 may be received. At an act 820 it may be determined if the boundary primary row of memory physically adjacent to the redundant row associated with redundant row address RTRA has been repaired. If the boundary primary row of memory has been repaired (e.g., by a redundant row of memory), the boundary primary row of memory is not refreshed at an act 825 (and neither is the row of memory associated with the TRAdd1 address). If the boundary primary row of memory is not repaired, however, the TRR redundancy row control circuit 312 may cause the boundary primary row of memory to be refreshed at an act 830.

At an act 835, the TRR redundancy control circuit 312 may cause the redundant row of memory associated with the redundant row address RTRAdd2 (e.g., physically adjacent the boundary redundant row of memory) to be refreshed instead of the row of memory associated with the row address TRAdd2. For example, at a step 840, the row address TRAdd2 may be received. It may be determined at an act 845 whether the redundant row of memory associated with the row address RTRAdd2 is enabled. If not, at an act 850 the redundant row of memory associated with the row address RTRAdd2 is not refreshed (and neither is the row of memory associated with the TRAdd2 address). If the redundant row of memory associated with the row address RTRAdd2 is enabled, however, the TRR redundancy control circuit 312 may cause the redundant row of memory to be refreshed at a step 855.

Figure 9:
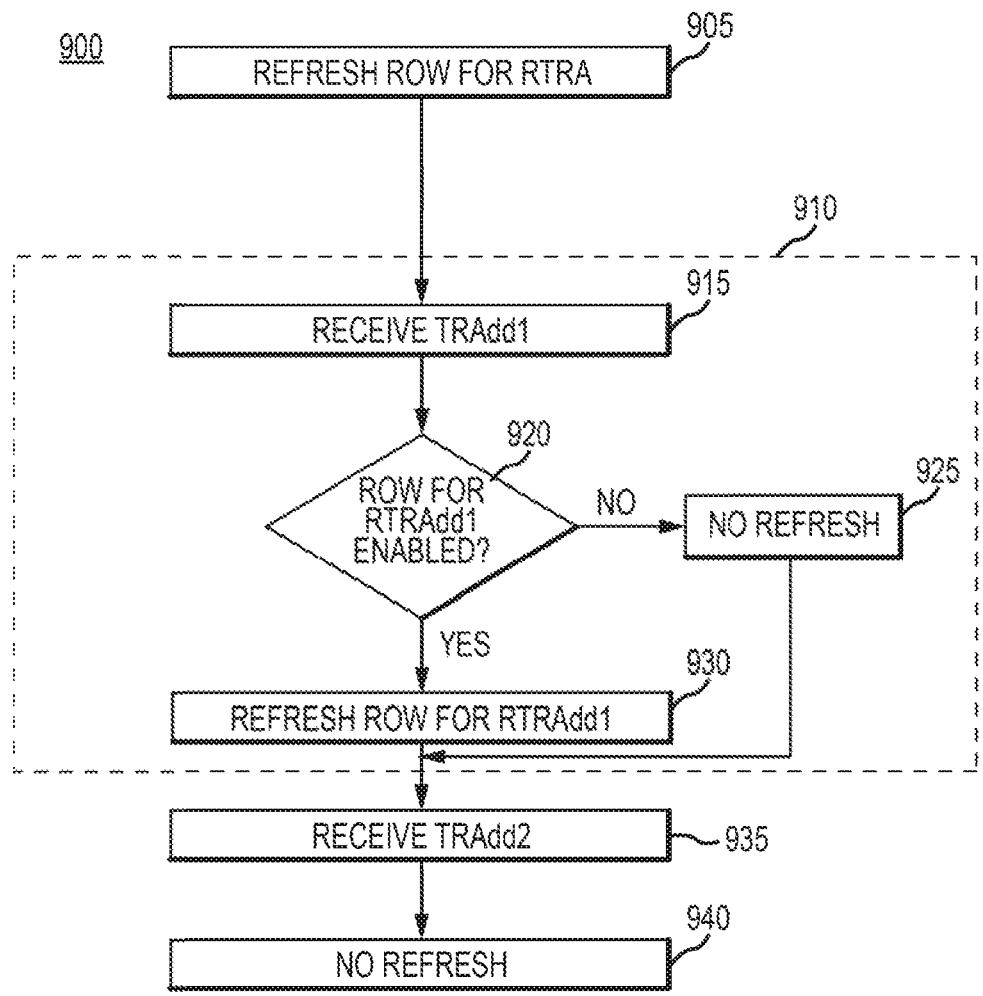
FIG. 9 is a flowchart of a method for refreshing an exterior row of a redundant portion of a memory section according to an embodiment of the invention.

FIG. 9 is a flowchart of a method 900 for refreshing an exterior row of a redundant portion of a memory section according to an embodiment of the invention. For example, the target row of memory may be an exterior redundant row of memory, such as the row 268 of FIG. 2, and a physically adjacent row of memory may be a redundant row of memory. The method 900 may be used to implement the act 450 of the method 400 of FIG. 4. At an act 905, the row address predecoder 302 may cause the redundant row of memory associated with the target row of memory to be refreshed. At an act 910, the TRR redundancy control circuit 312 may cause the row of memory associated with the redundant row address RTRAdd1 to be refreshed instead of the row of memory associated with the row address TRAdd1. If the row of memory associated with row address RTRAdd1 is not enabled, neither it nor the row of primary memory associated with the row address TRAdd1 are refreshed. For example, at an act 915, the row address TRAdd1 may be received. If it is determined at an act 920 that the row of memory associated with the redundant row address RTRAdd1 is not enabled, the redundant row address is not refreshed at an act 925 (and neither is the primary row address TRAdd1). If the row of memory associated with the redundant row address RTRAdd1 is enabled, however, the TRR redundancy control circuit 312 may cause the row of memory associated with the redundant row address RTRAdd1 to be refreshed at an act 930. At an act 935, the address TRAdd2 may be received. Because in the embodiment of the invention for the present example there is only one row of memory physically adjacent the exterior redundant row of memory, no row of memory is refreshed at step 940. With respect to methods 700, 800, and 900, described examples have been directed to refreshing rows adjacent a target row of memory that is a redundant row of memory. However, in some instances, based, at least in part, on the target row of memory being a redundant row of memory, all rows of memory of a redundant portion of memory may be refreshed.

Moreover, with respect to methods 500, 600, 700, 800, and 900, respective steps, such as step 505 of the method 500, are described as refreshing a target row associated with the target row address. However, as described, in at least some embodiments, the target row need not be refreshed, and only rows adjacent the target row may be refreshed.

The example methods previously described may be modified without departing from the scope of the present invention. For example, the example methods previously described may be applied to an arrangement of a primary portion of a memory section and a redundant portion of a memory section where a boundary primary row of memory is physically adjacent another primary row of memory having a preceding row address (e.g., TRAdd1), and also physically adjacent a boundary redundant row of memory on the other side of the boundary primary row of memory. In other embodiments, however, the primary portion and the redundant portion are arranged differently. For example, the boundary primary row of memory may be physically adjacent another primary row of memory, but the primary row of memory has a following row address (e.g., TRAdd2), and also physically adjacent a boundary redundant row of memory on the other side of the boundary primary row of memory. Still other arrangements of the primary portion and the redundant portion of a memory section may be included in the present invention as well.

Figure 10A:
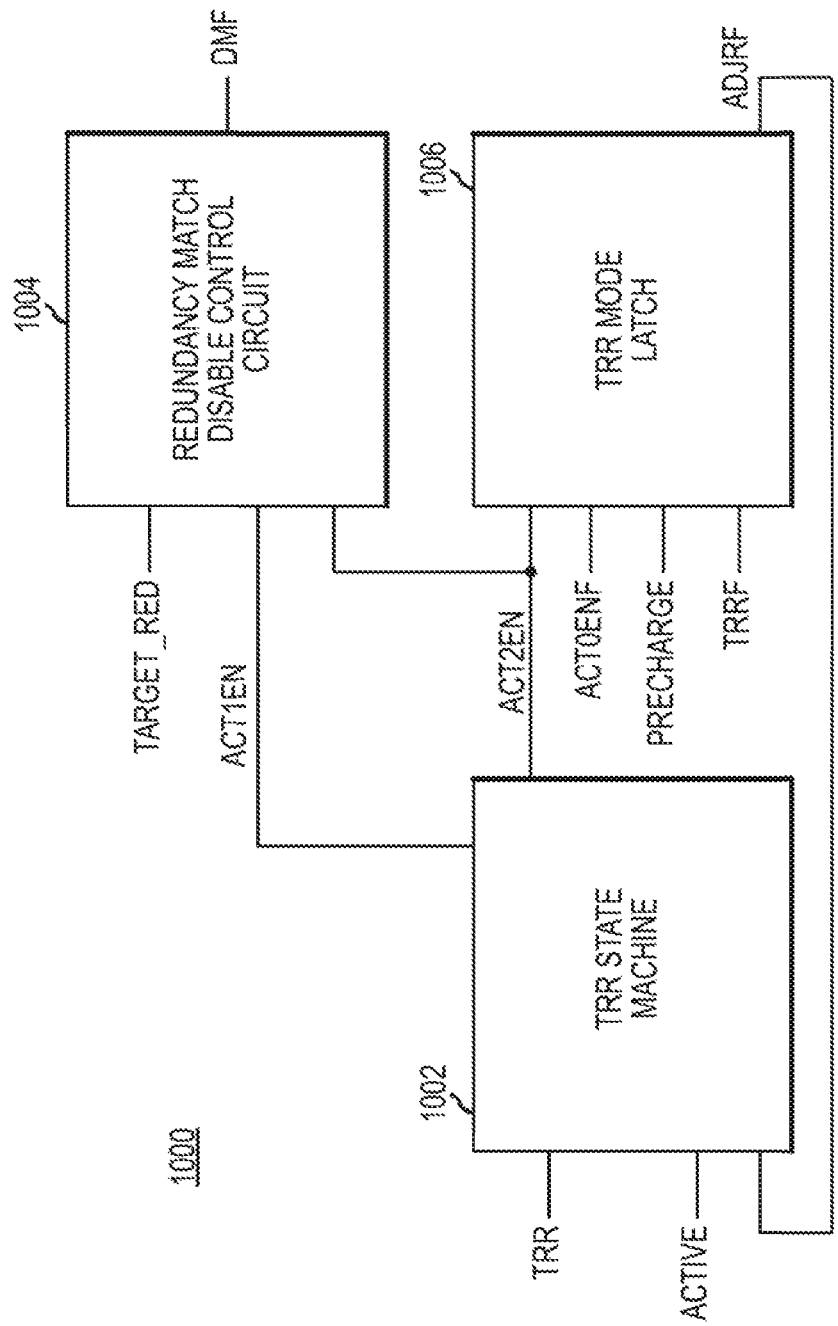
FIG. 10$a$ is a block diagram of a target row refresh state control circuit according to an embodiment of the invention.

FIG. 10*a* illustrates a TRR state control circuit 1000 according to an embodiment of the invention. The TRR state control circuit 1000 may be used to implement the TRR state control circuit 320 of FIG. 3. The TRR state control circuit 1000 may include a TRR state machine 1002, a redundancy match disable control circuit 1004, and a TRR mode latch 1006. The TRR state machine 1002 may be configured to receive TRR control signals and active commands and further may be configured to receive an ADJRF control signal from the TRR mode latch that may reset the TRR state machine 1002 when in an inactive state. The TRR state machine 1002 may be configured to enter a TRR mode based, at least in part, on a TRR control signal having an active state and an active command, and provide ACT1EN and ACT2EN control signals indicating respective states of the TRR state machine 1002. For example, in response to entering a TRR mode based, at least in part, on an active command corresponding to a first row address, the TRR state machine may enter a first state ACT0. Based, at least in part, on a second active command corresponding to a second row address, the TRR state machine may enter a second state ACT1 and may provide an active ACT1EN control signal to the redundancy match disable control circuit 1004. Based, at least in part, on a third active command, the TRR state machine 1002 may enter a third state ACT2 and may provide an active ACT2EN signal to both the redundancy match disable control circuit 1004 and the TRR mode latch 1006.

The redundancy match disable control circuit 1004 may configured to receive a TARGET_RED control signal, for instance, from a row redundancy control circuit, such as the row redundancy control circuit 310 of FIG. 3. The TARGET_RED control signal may indicate that the target row of memory is a redundant row of memory. In response to the TARGET_RED control signal and either the ACT1EN or ACT2EN control signals, the redundancy match disable control circuit 1004 may provide a control signal DMF to the row redundancy control circuit 310, for instance, to disable the row redundancy control circuit 310 from determining whether received rows (e.g., rows associated with row addresses TRAdd1 and TRAdd2) are repaired.

The TRR mode latch 1006 may be configured to receive the ACT2EN, ACT0ENF, and TRRF control signals and precharge commands. The TRRF control signal may be complement of a TRR control signal. Based, at least in part, on an active ACT0ENF control signal (e.g., complement of ACT0EN), the TRR mode latch circuit 1006 may provide and/or latch an active ADJRF control signal that may be provided to the TRR state machine 1002, as described. An active ADJRF control signal may prevent the TRR state machine 1002 from resetting such that the TRR state machine 1002 may progress through the ACT0, ACT1, and ACT2 states in a TRR mode. The TRR mode latch circuit 1006 may further be configured to reset based, at least in part, on the precharge command and an active ACT2EN control signal. In this manner, the TRR state machine 1002 may be reset by an inactive ADJRF control signal only after a final TRR active command has been received and a subsequent precharge command issued.

As described, in some instances, the target row may not be refreshed. Thus, in some embodiments, the TRR state control circuit 1000 may be implemented such that it progresses through two states, ACT0 and ACT1. This may result, for instance, because in refreshing only rows adjacent the target row, only two precharge commands may be issued.

Figure 10B:
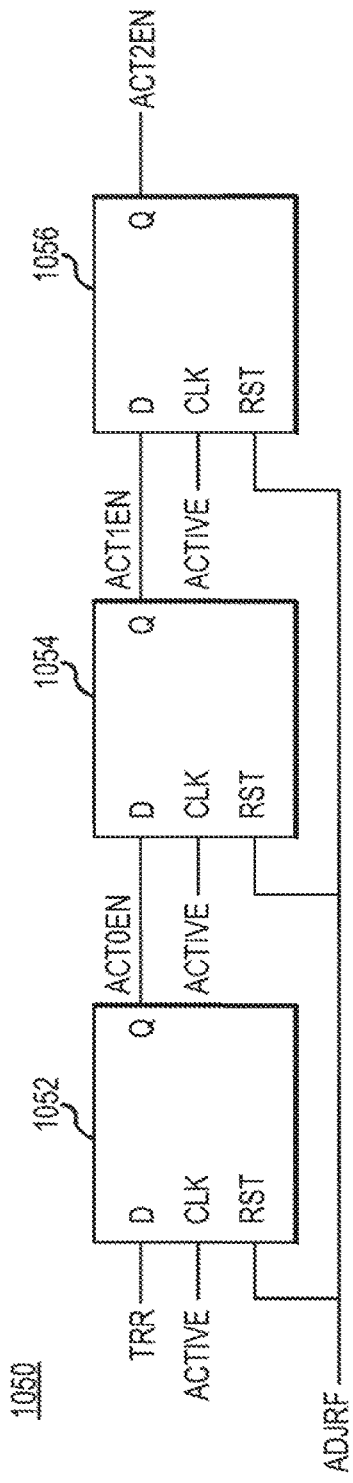

FIG. 10*b* illustrates a TRR state machine 1050 according to an embodiment of the invention. The TRR state machine 1050 may be used to implement the TRR state machine 1002 of FIG. 10*a* and may include a plurality of latches 1052, 1054, 1056. The TRR state machine 1050 may be configured to receive a TRR control signal and provide (e.g., propagate) the TRR signal through the latches 1052, 1054, and 1056 as control signals ACT0EN, ACT1EN, and ACT2EN, respectively, based, at least in part, on active commands corresponding to each of the received TRR active commands. Moreover, each of the latches 1052, 1054, and 1056 may receive the control signal ADJRF at a respective reset terminal such that an inactive ADJRF signal may hold each of the latches 1052, 1054, and 1056 in a reset state.

Figure 10C:
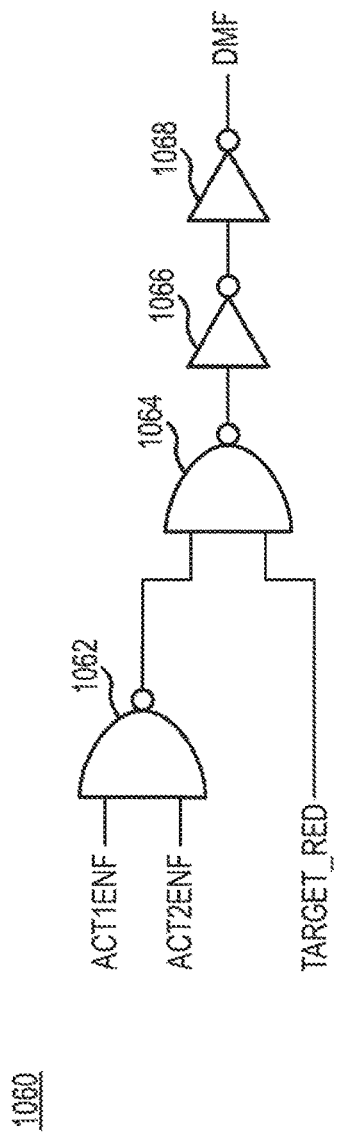

FIG. 10*c* illustrates a redundancy match disable control circuit 1060 according to an embodiment of the invention. The redundancy match disable control circuit 1060 may be used to implement the redundancy match disable control circuit 1004 of FIG. 10*a* and may include NAND gates 1062, 1064 and inverters 1066, 1068. The NAND gate 1062 may be configured to receive the ACT1EN and ACT2EN control signals and the NAND gate 1064 may be configured to receive the output of the NAND gate 1062 as well as the TARGET_RED control signal. The inverters 1066, 1068 may be coupled in series and may be configured to receive the output of the NAND gate 1064 to provide the control signal DMF.

Figure 10D:
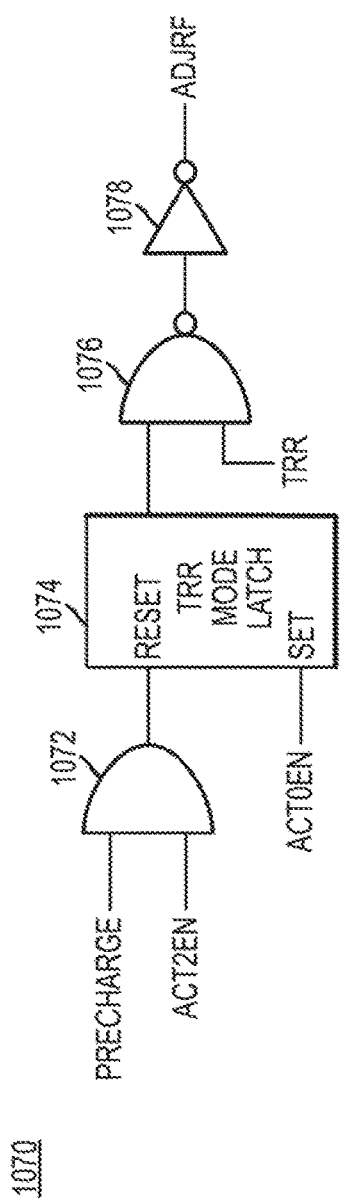

FIG. 10*d* illustrates a TRR mode latch circuit 1070 according to an embodiment of the invention. The TRR mode latch circuit 1070 may be used to implement the TRR mode latch circuit 1006 of FIG. 10*a* and may include an AND gate 1072, a NAND gate 1076, a TRR mode latch 1074, and an inverter 1078. The AND gate 1072 may be configured to receive precharge commands and the ACT2EN control signal. The TRR mode latch 1074 may be configured to receive the output of the AND gate 1072 and the ACT0EN control signal. The NAND gate 1076 may be configured to receive the output of the TRR mode latch and a TRR control signal, and the inverter 1078 may receive the output of the NAND gate 1076 to provide the control signal ADJRF. The AND gate 1072 may be configured to reset the TRR mode latch 1074 in response to an active ACT2EN control signal and a precharge command. In response to an active control signal ACT0EN, the TRR mode latch 1074 may be set. The TRR mode latch 1074 may be configured to latch the ACT0EN control signal such that the ADJRF control signal is active until the TRR mode latch 1074 is reset, for instance, by the final TRR sequence precharge command.

Figure 11A:
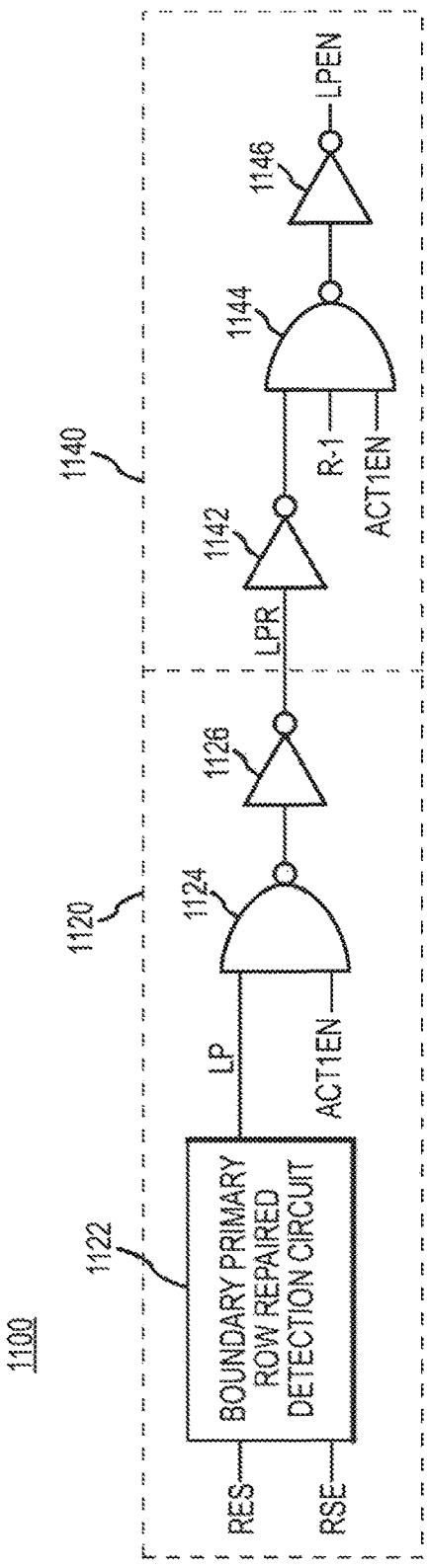
FIG. 11$a$ is a schematic diagram of a boundary row control circuit according to an embodiment of the invention.

FIG. 11*a* illustrates a boundary primary row control circuit 1100 according to an embodiment of the invention. The boundary primary row control circuit 1100 may be included in a TRR row address control circuit, such as the TRR row address control circuit 304 of FIG. 3, and may include a boundary primary disable control circuit 1120 and a boundary primary row refresh circuit 1140. The boundary primary disable control circuit 1120 may include a boundary primary row repaired detection circuit 1122, a NAND gate 1124, and an inverter 1126. The boundary primary row repaired detection circuit 1122 may be configured to receive a RES control signal indicating whether the boundary primary row has been repaired. The boundary primary row repaired detection circuit 1122 may further receive a control signal RSE indicating that the row associated with the TRA has been repaired. The boundary primary row repaired detection circuit 1122 may be configured to provide an active LP control signal based, at least in part, on the RES and RSE control signals having an active state. The NAND gate 1124 may receive the LP control signal and further receive the ACT1EN control signal. The inverter 1126 may receive the output of the NAND gate 1124 and provide a control signal LPR to the boundary primary row refresh circuit 1140 indicating during an ACT1 state whether the boundary primary row has been repaired.

The boundary primary row refresh circuit 1140 may include inverters 1142, 1146, and a NAND gate 1144. The inverter 1142 may be configured to receive the LPR control signal from the inverter 1126 of the boundary primary disable control circuit 1120 and provide an inverted LPR control signal to the NAND gate 1144. In addition to the inverted LPR control signal, the NAND date 1144 may receive the control signal ACT1EN and the control signal R−1. As will be explained, the control signal R−1 may be provided from a boundary redundant row control circuit, such as the redundant row control circuit 1205 of FIG. 12*a* described below, to indicate that the boundary redundant row is the RTRA and accordingly was refreshed based, at least in part, on the TRA. The inverter 1146 may be configured to receive the output of the NAND gate 1144 and if each of the control signals provided to the NAND gate 1144 are active, the inverter 1146 may provide an active control signal LPEN. In one embodiment, the control signal LPEN may be provided to pre-drivers (not shown) of the row address predecoder 302 to cause a refresh of the boundary primary row (recall the boundary primary row is adjacent the boundary redundant row) instead of a received row address TRAdd1.

Figure 11B:
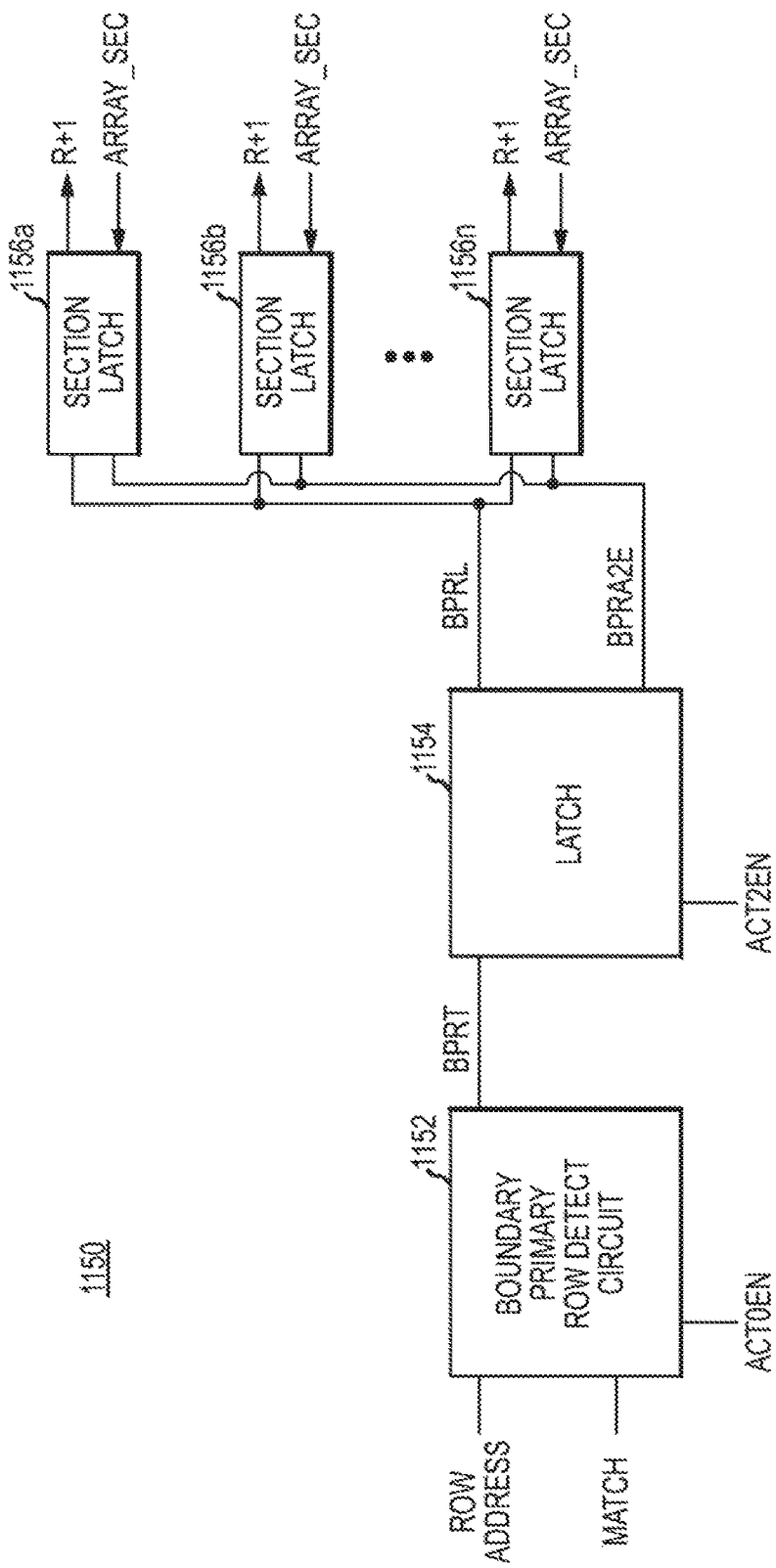

FIG. 11*b* illustrates a boundary primary row control circuit 1150 according to an embodiment of the invention. The boundary primary row control circuit 1150 may be included in a TRR row address control circuit, such as the TRR row address control circuit 304 of FIG. 3, and may include a boundary primary row detect circuit 1152, a latch 1154, and a plurality of section latches 1156*a-n*. Each of the section latches 1156 may correspond to a memory section of a bank to which a predecoder 300 corresponds. The boundary primary row detect circuit 1152 may be configured to receive a row address, for instance, a predecoded row address based, at least in part, on the target row address, and the MATCH and ACT0EN control signals. Based, at least in part, on the row address and the MATCH control signal, the boundary primary row detect circuit 1152 may determine if the target row address is for the boundary primary row. If the target row is the boundary primary row and not repaired, based, at least in part, on the control signal ACT0EN transitioning to an active state, the boundary primary row detect circuit 1152 may provide an active control signal BPRT to the latch 1154. The latch 1154 may receive the BPRT control signal and provide a latched control signal BPRL for the duration of a TRR mode. The BPRL control signal may be provided to each of the section latches 1156. In response to the control signal ACT2EN transitioning to an active state, the latch 1154 may further provide to each of the section latches 1156, a control signal BPRA2E, which in at least one embodiment, may be the complement of the control signal BPRL.

Each of the section latches 1156 may be configured to receive the control signal BPRL and further may each receive a control signal ARRAY_SEC from the row address predecoder 302 of FIG. 3. An active ARRAY_SEC control signal may cause one of the section latches 1156 to cause a refresh of the boundary redundant row of its corresponding memory section during the ACT2 state. A section latch 1156 receiving an active ARRAY_SEC control signal and an active BPRL control signal may internally latch the ARRAY_SEC control signal. Based, at least in part, on the BPRA2E control signal transitioning to an active state, the section latch 1156 may provide a respective R+1 control signal, thereby causing the redundant row of a corresponding memory section to be refreshed.

Figure 12A:
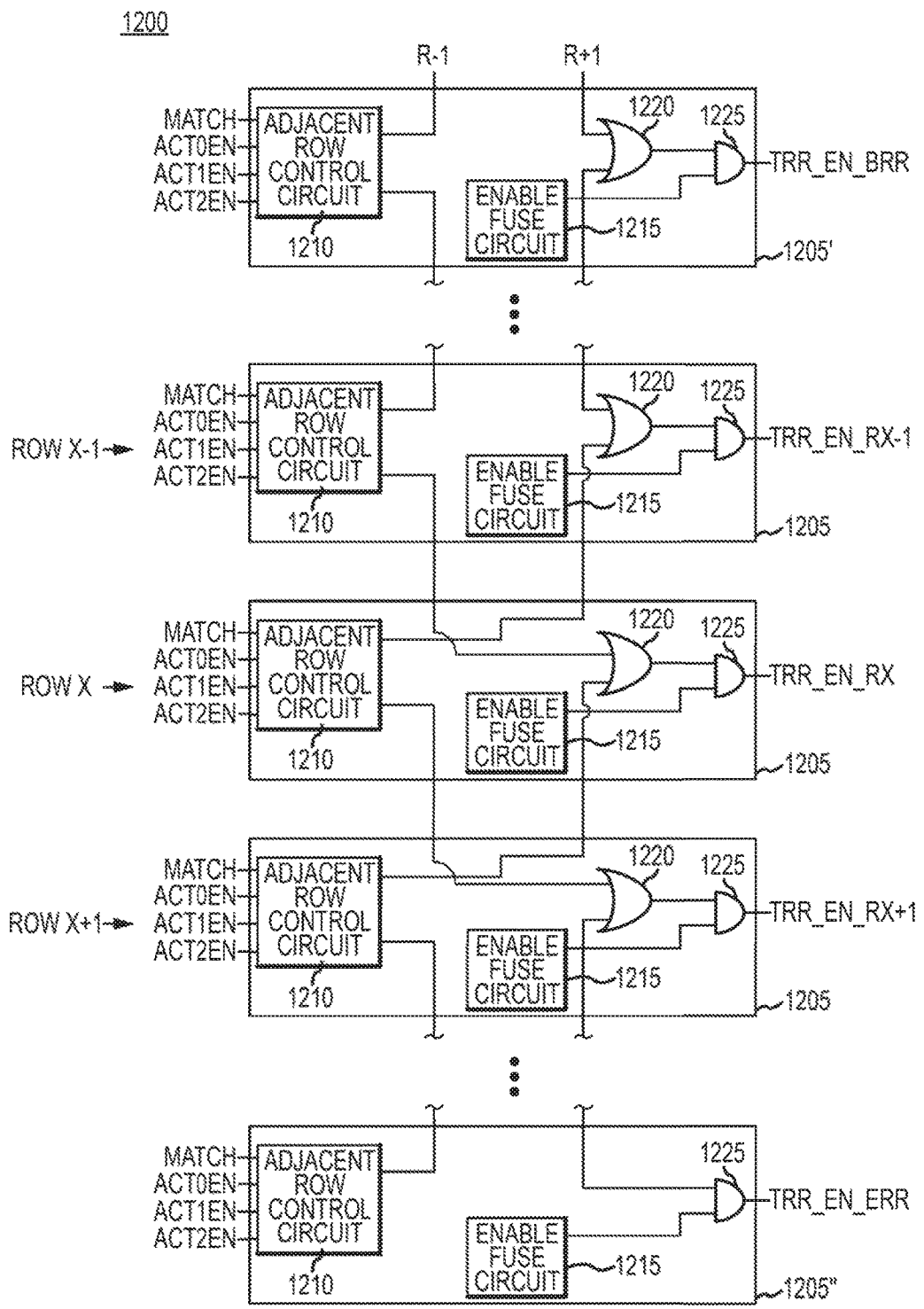
FIG. 12$a$ is a schematic diagram of a target row refresh redundancy control circuit according to an embodiment of the invention.

FIG. 12a is a schematic diagram of an adjacent redundant refresh circuit 1200 according to an embodiment of the invention. The adjacent redundant refresh control circuit 1200 may be used in a TRR redundancy control circuit, such as the TRR redundancy control circuit 312 of FIG. 3. The adjacent redundant refresh circuit 1200 may include a plurality of redundant row control circuits 1205. The plurality of redundant row control circuits 1205 may include a boundary redundant row control circuit 1205' and an exterior redundant row control circuit 1205". The remaining redundant row control circuits 1205 may be interior redundant row control circuits. As will be explained below, each of the redundant row control circuits 1205 may include an adjacent row control circuit 1210 that may be configured to cause refreshes of rows in accordance with embodiments herein. Each redundant row control circuit 1205 may further include enable fuse circuits 1215 that may be configured to provide a control signal indicating whether a respective redundant row is enabled. For example, the enable fuse circuit 1215 of the boundary redundant row control circuit 1205' may indicate whether the boundary redundant row is enabled. Each of the redundant row control circuits 1205 may further include an OR gate 1220 and/or an AND gate 1225 and may be configured to provide a row refresh control signal (e.g., TRR_EN_BRR) to cause a refresh of a respective redundant row.

In one embodiment, as illustrated in FIG. 12a, the adjacent row control circuit 1210 of the boundary redundant row control circuit 1205' may be configured to provide the control signal R−1, as described with respect to the boundary primary row refresh circuit of 1140 of FIG. 11a. Moreover, in at least one embodiment, the exterior redundant row control circuit 1205" may not include an OR gate 1220, as the exterior redundant row control circuit 1205" is adjacent to only one redundant row control circuit 1205.

Figure 12B:
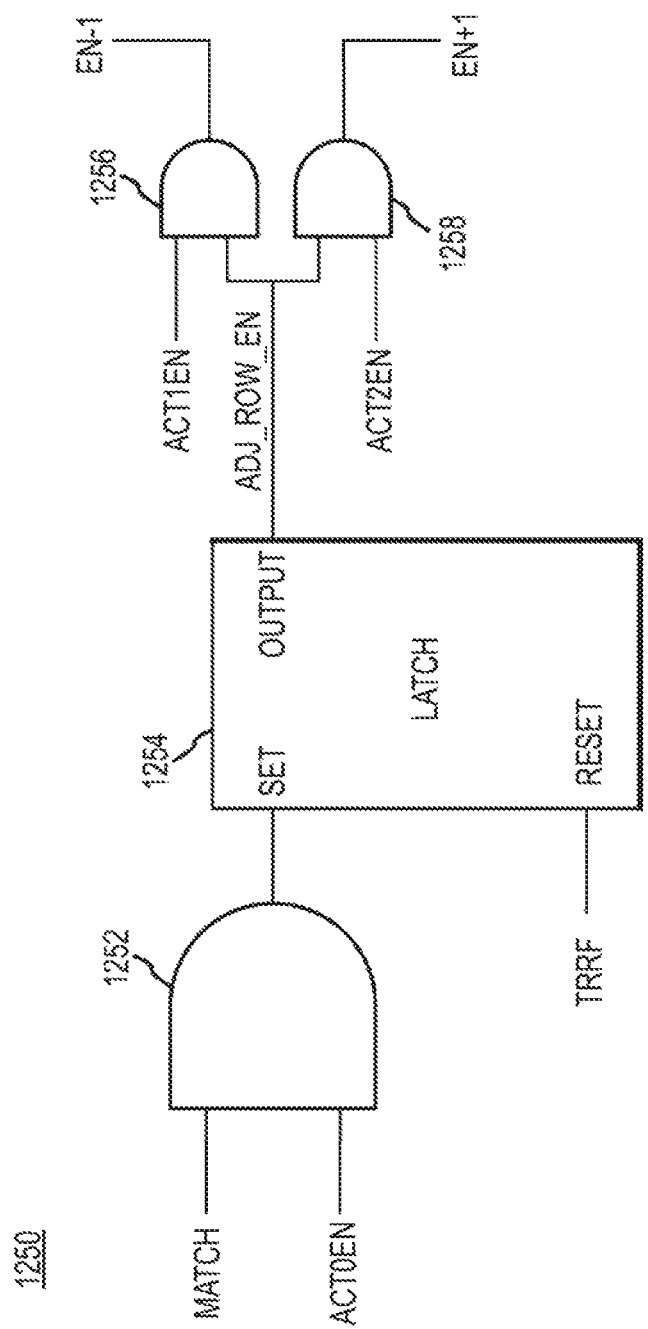

FIG. 12b is a schematic diagram of an adjacent row control circuit 1250 according to an embodiment of the invention. The adjacent row control circuit 1250 may include AND gates 1252, 1256, 1258, and a latch 1254. The AND gate 1252 may be configured to receive a MATCH control signal and the ACT0EN control signal. The output of the AND gate 1252 may be provided to the latch 1254. Based, at least in part, on the TRRENF control signal having an active state, the latch 1254 may provide a control signal ADJ_ROW_EN to the AND gates 1256, 1258. The AND gates 1256, 1258 may receive the control signals ACT1EN and ACT2EN, respectively. Based on the ACT1EN control signal having an active state, the AND gate 1256 may provide a control signal EN−1 to cause a refresh of a first adjacent redundant row. Similarly, based on the ACT2EN control signal having an active state, the AND gate 1258 may provide a control signal +1 to cause a refresh of a second adjacent redundant row.

With respect to FIGS. 12a and 12b an example operation of the TRR redundancy control circuit 1200 will now be described with respect to interior redundant row control circuits 1205. Based, at least in part, on a respective MATCH control signal and the ACT0EN control signal, the adjacent row control circuit 1210 of the redundant row control circuit 1205 corresponding to a Row X may internally latch a control signal ADJ_ROW_EN (see FIG. 12b). Based, at least in part, on the an active ACT1EN control signal, the adjacent row control circuit 120 may provide the control signal EN−1 to the OR gate 1220 of the adjacent row control circuit 1210 corresponding to a Row X−1. If the enable fuse circuit 1215 of the adjacent row control circuit 1210 corresponding to the Row X−1 indicates that the row is enabled, the AND gate 1225 may provide a control signal TRR_EN_RX−1 to cause the row X−1 to be refreshed.

The control signal ACT2EN may subsequently transition to an active state, and the adjacent row control circuit 120 may provide the control signal EN+1 to the OR gate 1220 of the adjacent row control circuit 1210 corresponding to a Row X+1. If the enable fuse circuit 1215 of the adjacent row control circuit 1210 corresponding to the Row X+1 indicates that the row is enabled, the AND gate 1225 may provide a control signal TRR_EN_RX+1 to cause the row X+1 to be refreshed. In this manner, redundant row control circuits 1205 may refresh adjacent rows provided the adjacent rows are enabled as indicated by respective enable fuse circuits 1215.

Examples have been described herein as including various control circuits. As described herein, a control circuit may include one or more logic circuits, control logic, logic gates, and/or any combination or sub-combination of the same. Examples as described herein have further been illustrated using the phrase "based at least in part," which may encompass, but is not limited to, "responsive, at least in part." Moreover, as used herein, the term apparatus may refer to, but is not limited to, for example, a device(s), a system(s), a chip(s), a chip package(s), a drive(s), a die(dice), or any combination or subcombination of the same.

While examples have been described herein with respect to the first row of the primary portion of a memory section being an exterior primary row and the boundary primary row being the last row of a primary portion of the memory section, it will be appreciated by those having ordinary skill in the art that other configurations may be used. For example, the first redundant row may be an exterior redundant row and the last redundant row may be a boundary redundant row. Moreover, portions of primary and redundant memory may be staggered such that a memory section includes multiple primary and/or redundant portions.

Examples have further been described with addresses having a decremented address (e.g., TRAdd1) as being associated with second row addresses received during a TRR mode and with addresses having an incremented address (e.g., TRAdd2) as being associated with third row addresses received during a TRR mode. It will be appreciated that second row addresses received may be incremented row addresses and third row addresses received may be decremented row addresses, and various control circuits and logic described herein may be adjusted to operate accordingly.

Examples have further been described with respect to operating in a TRR mode to cause a target row and/or rows adjacent the target row to be refreshed. It will be appreciated by those having ordinary skill in the art that other implementations may be used, such as those directed to refreshing any other number of rows. For example, in one embodiment a target row and/or 2 rows in each adjacent direction may be refreshed. In other embodiments, all rows may be refreshed, or rows in a primary portion or redundant portion only may be refreshed.

Examples have further been described with respect to causing refreshes of primary or redundant rows. It will be appreciated by those having ordinary skill in the art that examples described herein may be applied such that columns, or other groups of memory, may be refreshed. By way of example, in at least one embodiment, columns adjacent (e.g., physically adjacent) a target column may be refreshed.

Figure 13:
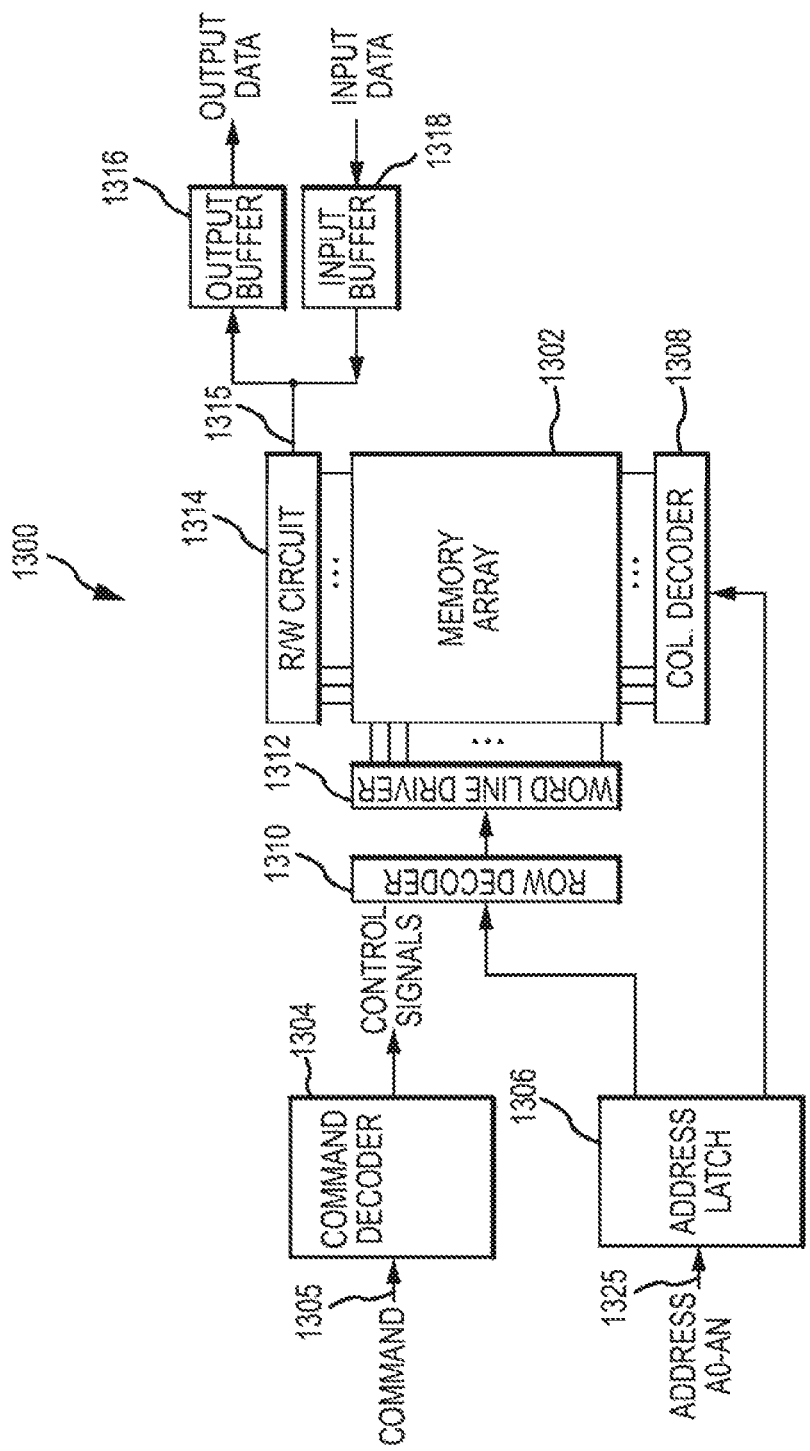
FIG. 13 is a block diagram of a memory including an apparatus according to an embodiment of the invention.

FIG. 13 is a part of a memory 1300 that may include the apparatus 100 of FIG. 1 according to an embodiment of the invention. The memory 1300 includes an array 1302 of memory cells, which may be, for example, DRAM memory cells, SRAM memory cells, flash memory cells, or some other types of memory cells and may include any number of banks and/or sections of memory as described herein. The memory 1300 includes an address/command decoder 1304 that receives memory commands (e.g., refresh commands) and addresses through an ADDR/CMD bus. The address/command decoder 1304 generates control signals, based on the commands received through the ADDR/CMD bus. The address/command decoder 1304 also provides row and column addresses to the memory 1300 through an address bus and an address latch 1306. The address latch then outputs separate column addresses and separate row addresses.

The row and column addresses are provided by the address latch 1306 to a row address decoder 1310 and a column address decoder 1308, respectively. The column address decoder 1308 selects lines extending through the array 1302 corresponding to respective column addresses. The row address decoder 1310 is connected to word line driver 1312 that activates respective rows of memory cells in the array 1302 corresponding to received row addresses. The selected line (e.g., a bit line or bit lines) corresponding to a received column address are coupled to a read/write circuitry 1314 to provide read data to a data output circuit 1316 via an input-output data bus 1315. Write data are provided to the memory array 1302 through a data input circuit 1318 and the memory array read/write circuitry 1314.

The memory 1300 may include an apparatus (not shown), which may be similar to the apparatus 100 described herein. For example, the apparatus may be included in the row decoder 1310 and/or the command decoder 1304, or in any other location in the memory 1300. A row decoder 1310 including the apparatus will allow for targeted refreshing of memory of the memory array 1302. For example, rows of memory that are physically adjacent a target row of memory may be refreshed accordingly when entered in a TRR mode.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
   determining whether a primary row of memory has been repaired and determining if one or more rows adjacent the primary row of memory are enabled;
   if the row of primary memory has not been repaired, refreshing the enabled ones of the one or more rows of memory physically adjacent the row of primary memory; and
   if the row of primary memory has been repaired, refreshing the enabled ones of the one or more rows physically adjacent a row of redundant memory associated with the primary row of memory.

2. The method of claim 1, wherein said refreshing one or more rows of memory physically adjacent the row of redundant memory associated with the row of primary memory comprises:
   refreshing a boundary row of primary memory.

3. The method of claim 1, wherein said refreshing one or more rows of memory physically adjacent the row of redundant memory associated with the row of primary memory comprises:
   refreshing a row of memory physically adjacent the row of redundant memory if enabled.

4. The method of claim 3, wherein said refreshing one or more rows of memory physically adjacent the row of redundant memory associated with the row of primary memory comprises:
   refreshing the row of redundant memory.

5. The method of claim 1, wherein said refreshing one or more rows of memory physically adjacent the row of primary memory comprises:
   determining whether one of the one or more rows of memory is an enabled boundary row of redundant memory; and
   refreshing the boundary row of redundant memory if enabled.

6. The method of claim 1, wherein the row of primary memory corresponds to a first memory section and the row of redundant memory corresponds to a second memory section.

* * * * *